(12) United States Patent
Wei et al.

(10) Patent No.: US 11,603,594 B2
(45) Date of Patent: Mar. 14, 2023

(54) BORON DOPED DIAMOND ELECTRODE AND PREPARATION METHOD AND APPLICATIONS THEREOF

(71) Applicant: Nanjing Daimonte Technology Co., Ltd., Nanjing (CN)

(72) Inventors: Qiuping Wei, Hunan (CN); Kezhao Zhou, Hunan (CN); Li Ma, Hunan (CN); Long Zhang, Hunan (CN); Zhiming Yu, Hunan (CN)

(73) Assignee: Nanjing Daimonte Technology Co., Ltd., Nanjing (CN)

( * ) Notice: Subject to any disclaimer, the term of this patent is extended or adjusted under 35 U.S.C. 154(b) by 819 days.

(21) Appl. No.: 16/342,976

(22) PCT Filed: Feb. 22, 2017

(86) PCT No.: PCT/CN2017/074374
§ 371 (c)(1),
(2) Date: Apr. 18, 2019

(87) PCT Pub. No.: WO2018/072367
PCT Pub. Date: Apr. 26, 2018

(65) Prior Publication Data
US 2020/0048776 A1    Feb. 13, 2020

(30) Foreign Application Priority Data

Oct. 21, 2016  (CN) .......................... 201610919507.6
Oct. 21, 2016  (CN) .......................... 201610920318.0

(51) Int. Cl.
*C23C 28/00*    (2006.01)
*C02F 1/461*    (2006.01)
(Continued)

(52) U.S. Cl.
CPC ........ *C23C 28/343* (2013.01); *C02F 1/46109* (2013.01); *C23C 14/165* (2013.01);
(Continued)

(58) Field of Classification Search
CPC .................. C02F 1/46109–2001/46171; C25B 11/04–11/097; G01N 27/30–27/38
See application file for complete search history.

(56) References Cited

U.S. PATENT DOCUMENTS

2004/0221796 A1*  11/2004  Swain ................... C23C 16/274
117/84

FOREIGN PATENT DOCUMENTS

CN        102242374        11/2011
CN        103270057        8/2013
(Continued)

OTHER PUBLICATIONS

Weimin et al. Effect of Structure of Ti/Boron-doped Diamond Electrode on the Electrochemical Degradation Performance for Aspirin. Chemical Journal of Chinese Universities, Sep. 2015, p. 1765-1770.*
(Continued)

*Primary Examiner* — Alexander W Keeling
(74) *Attorney, Agent, or Firm* — JCIPRNET

(57) ABSTRACT

A boron doped diamond electrode and its preparation method and application, the electrode is deposited with a boron or nitrogen doped diamond layer or a boron or nitrogen doped diamond layer composite layer on the surface of the electrode substrate, or after a transition layer is disposed on the surface of the substrate, a boron or nitrogen doped diamond layer or a composite layer of boron or nitrogen doped diamond layer is disposed on the surface of transition layer. The preparation method is depositing or plating a boron or nitrogen doped diamond layer on the
(Continued)

surface of the electrode substrate, or providing a transition layer on the surface of the electrode substrate, and then depositing or plating a boron or nitrogen doped diamond layer or a composite layer of boron or nitrogen doped diamond layer on the surface of the transition layer.

5 Claims, 11 Drawing Sheets

(51) Int. Cl.

| | |
|---|---|
| C23C 14/16 | (2006.01) |
| C23C 14/35 | (2006.01) |
| C23C 14/58 | (2006.01) |
| C23C 16/02 | (2006.01) |
| C23C 16/27 | (2006.01) |
| G01N 27/30 | (2006.01) |
| C02F 101/30 | (2006.01) |
| C23C 14/20 | (2006.01) |

(52) U.S. Cl.
CPC ............ *C23C 14/205* (2013.01); *C23C 14/35* (2013.01); *C23C 14/584* (2013.01); *C23C 16/02* (2013.01); *C23C 16/271* (2013.01); *G01N 27/308* (2013.01); *C02F 2001/46147* (2013.01); *C02F 2001/46161* (2013.01); *C02F 2101/30* (2013.01); *C02F 2305/08* (2013.01)

(56) References Cited

FOREIGN PATENT DOCUMENTS

| | | |
|---|---|---|
| CN | 104962876 | 10/2015 |
| CN | 105755307 | 7/2016 |
| CN | 105779804 | 7/2016 |
| CN | 105779805 | 7/2016 |

OTHER PUBLICATIONS

Song et al. ("Analytical Characteristics of Electrochemical Biosensor Using PtDispersed Graphene on Boron Doped Diamond Electrode", Electroanalysis, 2011, 23, No. 10, pp. 2408-2414). (Year: 2011).*

Huang et al., "Effect of Structure of Ti /Boron-doped Diamond Electrode on the Electrochemical Degradation Performance for Aspirin", Chemical Journal of Chinese Universities, Sep. 2015, pp. 1765-1770.

Ohashi et al., "Catalytic etching of {100}-oriented diamond coating with Fe, Co, Ni, and Pt nanoparticles under hydrogen". Diamond & Related Materials, Jul. 13, 2011, pp. 1165-1170.

"International Search Report (Form PCT/ISA/210)", dated Jul. 31, 2017, with English translation thereof, pp. 1-6.

* cited by examiner

BORON DOPED DIAMOND ELECTRODE AND PREPARATION METHOD AND APPLICATIONS THEREOF

CROSS-REFERENCE TO RELATED APPLICATION

This application is a 371 application of International PCT application serial no. PCT/CN2017/074374, filed on Feb. 22, 2017, which claims the priority benefit of Chinese application no. 201610920318.0, filed on Oct. 21, 2016, and Chinese application no. 201610919507.6, filed on Oct. 21, 2016. The entirety of each of the above-mentioned patent applications is hereby incorporated by reference herein and made a part of this specification.

BACKGROUND

Technical Field

This invention discloses a kind of boron doped diamond electrode and its preparation method and applications.

Description of Related Art

Diamond is a material with unique physical and chemical properties, it is not easy to react with acid, alkali, salts, and has good chemical stability. The diamond film electrode is considered to be a material with excellent physical and chemical properties. It has high mechanical strength, excellent chemical stability and electrochemical properties, and does not change significantly on the surface of the electrode under high-intensity current load. All the features above make it a broad prospect for electrochemical applications. In recent years, researchers have applied it to the field of electrochemical degradation of organic sewage, and found that the diamond electrode has excellent electrochemical properties, a wide potential window and a very low background current. By doping with boron, the diamond can be changed into a semiconductor or a conductor having metallic properties, thereby laying a foundation for its application in the electrode field. Compared to conventional electrodes, boron doped diamond electrode (BDD) film electrode has many advantages such as wide potential window, low background current, good electrochemical stability, good mechanical properties, strong corrosion resistance and good electrical conductivity, and has a good prospect in the field of electrochemical sewage treatment.

At present, researchers' researches on BDD electrodes mostly focus on plate electrodes, such as depositing diamond films on flat substrates like Si, Nb, Ti, and W. The conventional plate electrodes belong to two-dimensional electrodes, and their real electrode areas are similar to the apparent electrode areas. Low specific surface area of the electrode seriously restricts the mass transfer efficiency of electrode surface. Flat substrate belongs to two-dimensional substrate, the real electrode area is similar to the apparent electrode area, if the diamond film can be deposited on a porous three-dimensional substrate, the real area of the diamond film is bound to be increased compared to the flat substrate of the same apparent area.

In recent years, the continuous improvement of electrochemical processes and the emergence of new electrode materials and electrode structures provide updated and more effective solutions for electrochemical research. By designing different electrode configurations such as cylindrical, planar spiral, cylindrical spiral, planar braided network, three-dimensional braided network, honeycomb porous, foam porous, etc., free flow of fluid is obtained on the surface of diamond with high specific surface area, greatly improve the mass transfer process and enhance current efficiency.

Compared with the powder metallurgy sintered porous electrode material, the foam electrode material has a high porosity up to 99% and a larger specific area. Moreover, we can obtain uniform foam electrode materials in three-dimensional direction with stable performance by controlling the raw materials and preparation process, and the parameters such as the size, the number of holes and the thickness of the electrode material can be easily realized by controlling the size of the foam substrate. At the same time, because the electrode has a developed spatial structure, the specific surface area of the electrode material is greatly increased, and the activity of the electrode is increased under a certain strength maintained. The process of preparing the foam electrode can be controlled to achieve the purpose of controlling the composition and structure of the electrode material, and finally realize the requirements of high-performance electrode. Obviously, such materials have large electrochemical reaction interfaces and have great application prospects in electrochemical electrode materials.

In recent years, more and more nano-materials have been used in the fabrication of sensor-modified electrodes due to their excellent performance. The working electrode modified with nano-materials has increased current response intensity as the surface area increases. Graphene nano-materials have gradually become an important class of electrode modification materials because of their advantages of simple synthesis, low cost, controllable morphology, good biocompatibility and electrical conductivity. Carbon nanotubes are also an ideal electrode modification materials because of their large specific surface area, good crystallinity and good electrical conductivity.

SUMMARY

An object of the invention is to provide a boron doped diamond electrode having a reasonable structure, high electrocatalytic activity, and high current efficiency, and its preparation method and applications for overcoming the deficiencies of the existing techniques.

Another object of this invention is to utilize a boron-doped diamond of different configurations as the electrode matrix, catalytically etch a uniformly distributed holes and sharp cones on the surface by thermal catalytic etching technique, then, a boron-doped electrode with large specific surface area, a preparation method and applications thereof are obtained. The electrode obtained by this method can further combine the excellent electrochemical properties of graphene and carbon nanotubes, and use it to prepare a BDD electrode with high electrocatalytic activity and high use efficiency.

The boron doped diamond electrode described in the present invention is characterized in that the electrode is provided with a modified layer on the surface of the foam metal skeleton, and then a boron or nitrogen doped diamond layer or a boron or nitrogen doped diamond composite layer is disposed on the surface of the modified layer;

The boron doped diamond electrode described in the present invention is provided with a layer of metal Nb on the surface of the foam skeleton, or a layer of modified layer is disposed on the surface of the foam skeleton and then a layer of metal Nb is disposed on the surface of the modified layer. The electrode matrix is further composed of a boron or nitrogen doped diamond layer or a boron or nitrogen doped diamond composite layer on the surface of electrode matrix.

The boron doped diamond electrode described in the present invention is characterized in that the foam skeleton is selected from one of a sponge, a metal or an alloy foam, a foamed organic matter, a foamed non-metallic inorganic substance.

The boron doped diamond electrode described in the present invention is characterized in that the foamed skeleton substrate has a pore diameter of 0.01 to 10 mm, an open porosity of 20% to 99%, and the pores are evenly distributed or randomly distributed; the foam substrate is a two-dimensional planar sheet structure or a three-dimensional structure; The thickness of the niobium deposit layer is 5 μm-3 mm.

The metal foam or alloy foam is selected from the one of nickel foam, copper foam, titanium foam, cobalt foam, tungsten foam, molybdenum foam, chromium foam, iron nickel foam, aluminum foam; the foamed non-metallic inorganic substance is selected from the one of the group consisting of $Al_2O_3$ foam, $ZrO_2$ foam, SiC foam, $Si_3N_4$ foam, BN foam, $B_4C$ foam, AlN foam, WC foam, and $Cr_7C_3$ foam; the foamed organic matter is selected from the one of polyurethane (PUR), polystyrene (PS), polyvinyl chloride (PVC), polyethylene (PE), phenolic resin (PF), etc.

The boron doped diamond electrode described in the present invention is characterized in that the modified layer material is selected one or more kind from the group consisting of titanium, nickel, tungsten, molybdenum, chromium, ruthenium, platinum, silver, and silicon.

The boron doped diamond electrode described in the present invention is characterized in that the boron-doped or nitrogen-doped diamond composite layer is selected from the one of the group consisting of graphene coated boron or nitrogen doped diamond, carbon nanotube coated boron or nitrogen doped diamond, carbon nanotube/graphene coated boron or nitrogen doped diamond.

In this invention, a layer of metal niobium is disposed on the surface of the foam skeleton, or a modified layer is disposed on the surface of the foam skeleton and then a metal niobium is disposed on the surface of the modified layer to form the electrode matrix. Then, a boron or nitrogen doped diamond layer or a boron or nitrogen doped diamond composite layer is disposed on the surface of the electrode matrix to form an electrode, which is applied to the fields of electrochemical synthesis, electrochemical wastewater purification treatment, electrochemical detection, and electrochemical biosensor;

When the boron doped diamond electrode described in the present invention is applied to wastewater treatment, due to the boron or nitrogen doped diamond foam electrodes has spatial network interpenetrating porous structures, more efficient and energy-saving treatment methods can be produced in combination with ozone oxidation, photocatalytic degradation, and bio-oxidation techniques.

The method for preparing a boron doped diamond electrode in the invention includes the following steps;

Step one, the metal Nb layer on the surface of foam skeleton is prepared by magnetron sputtering or chemical electro-deposition method; or using one or more kind of chemical plating, electroplating, electrostatic adsorption, electrophoresis method to provide a modified layer on the surface of the foam organic skeleton or the foamed inorganic skeleton, and then providing a metal niobium layer on the surface of modified layer to obtain the electrode matrix;

Step two, a boron or nitrogen doped diamond layer or a boron or nitrogen doped diamond composite layer is uniformly deposited on the surface of electrode matrix using chemical vapor deposition technique.

In the first step of the preparation method of the boron doped diamond electrode described in this invention, The process parameters of magnetron sputtering to deposit a metal Nb layer on the surface of foam skeleton are as follows:

Using DC magnetron sputtering system, the working gas is high purity argon gas, the target is high purity metal Nb target, working pressure is 0.6 Pa, sputtering power is 120-200W, target and sample distance is 50-100 mm, deposition the rate is 10-500 nm/min, and the deposition time is 5 min-1000 min.

The process parameters of chemical electrodeposition deposition of metal Nb layer are:

The chemically deposited metal Nb layer is used as the cathode of the foam skeleton, and the high-purity Nb plate is used as the anode. It is sanded with a sandpaper, mechanically polished to a bright mirror surface, acetone is washed for 1-10 minutes, dilute hydrochloric acid is activated for 1-10 minutes, and deionized water is rinsed. It is degreased with acetone and air-dried; the electrolyte is composed of ionic liquid choline chloride and ethylene glycol molar ratio 1:2, using constant current deposition, constant current density is 0.10-0.05 $mA/cm^2$, electrode position temperature is 140-150° C., the deposition time is 5-300 min, and the thickness of the ruthenium plating layer is 1-50 μm; The purity of high purity argon gas is greater than or equal to 99.99%; the purity of high purity metal Nb target is greater than or equal to 99.95%; the foam metal skeleton is first washed with 1 vol. % HCl to remove surface metal oxide, and then washed with acetone to remove surface oil, and then connected to the cathode of the electrodeposition system; the foamed organic or foamed inorganic substance is deposited on the surface by a chemical plating, electroplating, electrostatic adsorption, electrophoresis or composite method, the electrodes are then connected to the cathode of the electrodeposition system. In the second step, described in the preparation method of the boron doped diamond electrode in this project.

The process parameters for depositing boron or nitrogen doped diamond layers are:

The electrode matrix obtained in the first step is placed in a chemical vapor deposition furnace, or seeding the surface of the electrode matrix then placed in a chemical vapor deposition furnace, and the carbon-containing gas accounts for 0.5-10.0% of the total mass flow rate of the gas in the furnace; the growth temperature is 600-1000° C., and the growth pressure is $10^3$-$10^4$ Pa. Obtaining an electrode matrix with a boron or nitrogen doped diamond layer on its surface; the boron source is one of a solid, liquid, and gaseous boron source. When the boron source is a gas boron source, the boron-containing gas of the total gas mass flow ratio in the furnace is 0.1-1%; the nitrogen source uses one of nitrogen or ammonia gas, the nitrogen-containing gas of the total gas mass flow ratio in the furnace is 0.1-1%;

Deposited graphene coated boron or nitrogen doped diamond composite layer:

The electrode matrix of boron or nitrogen doped diamond layer was deposited in a chemical vapor deposition furnace, direct deposition of graphene; the deposition parameters are as follows: the carbon-containing gas of the total mass flow rate in the furnace is 5-80%; the growth temperature is 400-1200° C., the growth pressure is 5-$10^5$ Pa; the plasma current density is 0-50 $mA/cm^2$; the magnetic field strength in the deposition zone is 100 Gauss to 30 Tesla; or Depositing one or more modified layers of nickel, copper, cobalt on the boron-doped or nitrogen-doped diamond surface by a method of electroplating, electroless plating, evaporation, magnetron sputtering, chemical vapor deposition and physical vapor deposition, redeposition of graphene, obtaining graphite-coated boron-doped diamond foam skeleton;

Depositing carbon nanotube coated boron-doped diamond composite layer:

The electrode matrix of boron doped diamond layer was deposited in a chemical vapor deposition furnace, directly deposition of carbon nanotubes; the deposition parameters are: carbon-containing gas of the total mass flow rate of the gas in the furnace is 5-50%; the growth temperature is 400-1300° C., the growth pressure $10^3$-$10^5$ Pa; plasma current density is 0-30 mA/cm$^2$; the magnetic field strength in the deposition area is 100 Gauss to 30 Tesla; or Depositing one or more modified layers of nickel, copper, cobalt on the boron-doped or nitrogen doped diamond surface by a method of electroplating, electroless plating, evaporation, magnetron sputtering, chemical vapor deposition and physical vapor deposition, and then depositing carbon nanotubes, to obtain a foam skeleton with carbon nanotubes coated boron-doped or nitrogen-doped diamond;

Depositing carbon nanotubes/graphene coated boron-doped or nitrogen-doped diamond composite layer:

The electrode matrix on which the boron-doped or nitrogen-doped diamond layer has been deposited is placed in a chemical vapor deposition furnace, directly deposit carbon nanotubes and graphene composites.

The deposition parameters of carbon nanotube forest are as follows: carbon-containing gas accounts for 5-50% of the total gas mass flow rate in the furnace; the growth temperature is 400-1300° C., and the growth pressure is $10^3$-$10^5$ Pa; the plasma current density is 0-30 mA/cm$^2$; and the magnetic field intensity in the deposition area is 100 Gauss to 30 Tesla; the deposition parameters of graphene wall are as follows: carbon-containing gas accounts for 5-80% of total gas mass flow rate in furnace; the growth temperature is 400-1200° C., and the growth pressure is 5-$10^5$ Pa; the plasma current density is 0-50 mA/cm$^2$; and the magnetic field intensity in deposition area is 100 Gauss to 30 Tesla; or Depositing one or more modified layers of nickel, copper and cobalt on the boron doped or nitrogen doped diamond surface by a method of electroplating, electroless plating, evaporation, magnetron sputtering, chemical vapor deposition and physical vapor deposition; and then depositing carbon nanotubes/graphene; to obtain a foam skeleton with carbon nanotubes/graphene coated boron doped or nitrogen doped diamond.

The invention relates to a method for preparing a boron doped diamond electrode, which consists of cleaning, drying an electrode matrix on which a boron-doped or nitrogen doped diamond layer has been deposited in a chemical vapor deposition furnace, when depositing graphene, carbon nanotubes, carbon nanotubes/graphene, applying plasma-assisted growth on the foam substrate, and adding a magnetic field at the bottom of the foam substrate, confining the plasma to the near surface of the foam substrate, enhancing the bombardment of plasma on the surface of the foam substrate, making graphene or/and carbon nanotubes vertically growing on the surface of the diamond, which form a carbon nanotube forest or a graphene wall, and obtaining a three-dimensional space network with uniformly distributed graphene wall coated diamond, carbon nanotube forest coated diamond or carbon nanotube forest/graphene wall coated diamond porous electrode.

The present invention relates to a method for preparing a boron doped diamond electrode, a method for seeding the surface of the electrode matrix are:

The electrode matrix is placed in a suspension of the nanocrystalline and microcrystalline diamond mixed particles, oscillated and dispersed uniformly in the ultrasonic wave, the nanocrystalline and microcrystalline diamond particles are adsorbed on the surface of the electrode matrix mesh; or Configuring an aqueous or organic solution containing nano or micron diamond, nanocrystalline and microcrystalline diamond particles are adsorbed on the surface of electrode matrix mesh by electrophoretic deposition.

The present invention relates to a method for preparing a boron doped diamond electrode, which the boron doped or nitrogen doped diamond layer or composite layer has a thickness of 0.5 μm-500 μm, and the boron or nitrogen content in the boron doped or nitrogen doped diamond layer is 100-3000 ppm.

The present invention relates to a method for preparing a boron doped diamond electrode, which has the micron-sized boron-doped or nitrogen-doped diamond and nano-scale boron doped or nitrogen doped diamond morphology, and presents a gradient from the outer layer of the foam skeleton to the inner layer, the morphology distribution is specifically micron boron-doped or nitrogen-doped diamond morphology on the outer layer of the foam skeleton; the inner layer of the foam skeleton is nano-scale boron-doped or nitrogen-doped diamond shaped; the grain size is 1 nm-300 μm.

The present invention relates to a method for preparing a boron doped diamond electrode, which the surface of the boron doped diamond electrode is subjected to phase-free etching, further increase the specific surface area of the boron-doped or nitrogen doped diamond; and the phase-free etching is performed by using an active H atom or high energy laser, which uniformly distribute a large number of micropores on the surface of the diamond;

The present invention relates to a method for preparing a boron doped diamond electrode, which is directed to a boron doped diamond electrode applied to biosensors, the surface is subjected to metal thermal catalytic etching treatment, and the metal for thermal catalytic etching is selected from the group consisting of nickel, copper, gold, silver, cobalt and bismuth, the thickness of the metal by thermal catalytic etching is 1-900 nm, and the temperature of the thermal catalytic etching is 700-1000° C., and the time is 1-180 minutes.

The present invention relates to a method for preparing a boron doped diamond electrode, including electrode substrate, which substrate is provided with a layer of boron doped or nitrogen doped diamond, or after setting a transition layer on the surface of the substrate, and then a layer of boron-doped or nitrogen-doped diamond is disposed on the surface of the transition layer, metal particles are distributed in the diamond layer, micropores and/or sharp cones are distributed on the surface of the diamond layer.

The present invention relates to a method for preparing a boron doped diamond electrode. the electrode substrate material is selected from one of metal nickel, ruthenium, copper, titanium, cobalt, tungsten, molybdenum, chromium, iron or an alloy thereof; or the electrode substrate material is selected from one of ceramics $Al_2O_3$, $ZrO_2$, SiC, $Si_3N_4$, BN, $B_4C$, AlN, WC and $Cr_7C_3$.

The present invention relates to a method for preparing a boron doped diamond electrode, which the electrode structure is one of the planar type, cylindrical type, plane spiral type, cylindrical spiral type, planar braided network type, three-dimensional braided network type, honeycomb porous type and foamed porous type.

The present invention relates to a method for preparing a boron doped diamond electrode, wherein the transition layer material is selected from the composite of one or more of the titanium, tungsten, molybdenum, chromium, ruthenium, platinum, silver, aluminum, copper and silicon; the transition layer is prepared on the surface of the foam skeleton by one of the electroplating, electroless plating, evaporation, magnetron sputtering, chemical vapor deposition and physical vapor deposition.

The present invention relates to a method for preparing a boron doped diamond electrode, graphene or/and carbon nanotube layer is deposited on the surface of a diamond layer having micropores and/or sharp cones.

The present invention relates to a method for preparing a boron doped diamond electrode, which is uniformly deposited on the surface of the substrate by a chemical vapor deposition method, and the thickness of the diamond layer ranges from 1 μm to 2 mm.

The present invention relates to a method for preparing a boron doped diamond electrode, which the metal particle material distributed in the diamond layer is selected from the group consisting of metal iron, cobalt, nickel, ruthenium, platinum, cobalt, gold, tungsten, silver, copper, silver, palladium and ruthenium.

The present invention relates to a method for preparing a boron doped diamond electrode. The surface of the diamond layer has a pore size ranging from 500 nm to 5 mm, and the diameter of the tip cone is in the range of 1 μm to 30 μm.

The present invention relates to a method for preparing a boron doped diamond electrode, including the following steps:

Step One, Electrode Matrix Pretreatment

First, the metal oxide on the surface of the electrode matrix is removed by 1 vol. % HCl, then the surface oil is removed by acetone, and the electrode matrix is placed in ethanol for ultrasonic vibration cleaning, and taken out for drying;

Step Two, Sedimentary Transition Layer

The intermediate transition layer is prepared on the surface of the foam skeleton by one of the electroplating, electroless plating, evaporation, magnetron sputtering, chemical vapor deposition and physical vapor deposition. The intermediate transition layer includes one or the composite metal layer of nickel, copper, tungsten, molybdenum, titanium, silver and chromium;

Step Three, Seed Treatment on Electrode Matrix Surface

The mixed nanocrystalline and/or microcrystalline diamond particles, electrode matrix and solvent were mixed, after being shaken for 1-30 minutes in the ultrasonic wave, dispersed evenly, the electrode matrix was removed and dried, which obtained the electrode matrix embedded with a large number of nanocrystalline and/or microcrystalline diamond particles;

Step Four, Deposition of Boron Doped or Nitrogen Doped Diamond Layers

The electrode matrix obtained in the third step is placed in a chemical vapor deposition furnace, where the carbon-containing gas accounts for 0.5-10.0% of the total gas mass flow rate in the furnace; the growth temperature is 600-1000° C., and the growth gas pressure is $10^3$-$10^4$ Pa; the boron source is one of the solid, liquid, and gaseous boron sources. When the source is a gaseous boron source, the boron-containing gas accounts for 0.1-1% of the total gas mass flow ratio in the furnace; and the nitrogen source uses one of nitrogen or ammonia;

Step five, preparation of micropores and/or sharp cones on the surface of boron-doped or nitrogen-doped diamond layers After cleaning and drying the electrode matrix on which the boron doped or nitrogen doped diamond layer has been deposited, the first metal layer having a higher catalytic ability for carbon is deposited on the surface of the diamond by magnetron sputtering or electroless plating, first metal layer material is selected from one of metal iron, cobalt, nickel or composite;

The first high temperature heat treatment of the boron doped or nitrogen doped diamond layer of the deposited metal layer is performed by a tube furnace or a CVD furnace, which spheroidizes the first metal layer at a high temperature to form a mass distribution nanosphere on the diamond surface and/or Microsphere; The first time high temperature heat treatment temperature is 600-1000° C., time is from 1 min to 3 h, the furnace atmosphere is selected from one or a mixture of $CH_4$, $H_2$, $N_2$, Ar and other gases, the furnace pressure is 0.1-1 atmosphere;

The carbon atoms in the diamond are continuously dissolved in the metal nanospheres or microspheres at high temperatures, and the solid carbon precipitated by the supersaturated solid solution of the carbon atoms in the metal lattice is etched by adding hydrogen gas, so that the metal balls are continuously turned to the diamond. Internal migration, eventually forming a large number of micropores and/or sharp cones on the diamond surface;

Controlling the size, shape and distribution of micropores and sharp cones by the first high temperature heat treatment temperature, atmosphere, time and thickness of the metal layer;

The surface of the boron or nitrogen doped diamond layer obtained by the above catalytic etching may be removed by using an acidic solution to remove residual metal on the surface;

After removing the metal on the surface of the boron or nitrogen doped diamond layer obtained by the above catalytic etching by an acidic solution, a second metal layer is prepared which does not form carbides and does not form solid solution of carbon atoms at high temperatures on the surface of a boron-doped or nitrogen diamond electrode containing a large number of micropores and/or sharp cones. The second metal layer material is selected from one or combination of metals such as ruthenium, platinum, gold, silver, copper, palladium, iridium and so on, and then, the metal layer is spheroidized into nano metal balls by a second high temperature heat treatment in a protective atmosphere or a vacuum. Finally, the nano metal spherical particles are embedded in the micropores, thereby improving the holding ability of the non-solid solution carbon atom metal nanoparticles without forming carbides and high temperature, and finally achieving the catalytic activity of the electrode stable improvement for a long term; The second high temperature heat treatment temperature is 600-1000° C., the treatment time is 1 m -3 h, and the furnace atmosphere is selected from vacuum, $N_2$ or Ar gas or a mixed gas, and the pressure in the furnace is 0 Pa -1 atm.

The invention discloses a prepared method of a boron doped diamond electrode, which deposits graphene or carbon nanotube layers on the surface of a diamond layer with micropores or sharp cones by chemical vapor deposition. The method furtherly increases the specific surface area, electrical conductivity and electrocatalytic performance of the composite electrode material, thereby improving the sewage treatment efficiency of the electrode; the specific deposition process's parameters are:

Depositing Graphene Coated Boron or Nitrogen Doped Diamond Composite Layer:

The electrode matrix of the catalytically etched boron or nitrogen doped diamond layer is deposited in a chemical vapor deposition furnace to deposit graphene; the deposition parameters is: the carbon-containing gas accounts for 5-80% of the total mass flow rate of the gas in the furnace; The growth temperature is 400-1200° C. and the growth pressure is 5-10$^5$ Pa; Plasma current density 0-50 mA/cm$^2$;The magnetic field strength in the deposition area is 100 G to 30 T, a composite electrode having a graphene Surface coated boron or nitrogen doped diamond is obtained;

Depositing Carbon Nanotube Coated Boron or Nitrogen Doped Diamond Composite Layer:

The electrode matrix of the catalytically etched boron or nitrogen doped diamond layer is placed in a chemical vapor deposition furnace, and the carbon nanotubes are directly deposited; The deposition parameter is: the carbon-containing gas accounts for 5-50% of the total mass flow rate of the gas in the furnace; The growth temperature is 400-1300° C. and the growth pressure is 10$^3$-10$^5$ Pa; Plasma current density 0-30 mA/cm$^2$; The magnetic field strength in the sedimentary zone is 100 G to 30 T, a composite electrode having a carbon nanotubes surface coated boron or nitrogen doped diamond is obtained;

Depositing Carbon Nanotube/Graphene Coated Boron or Nitrogen Doped Diamond Composite Layer:

The electrode matrix on which the boron or nitrogen doped diamond layer has been deposited is placed in a chemical vapor deposition furnace, and the carbon nanotubes and the graphene composite are directly deposited; The carbon nanotube forest is firstly deposited, and the deposition parameters are: the carbon-containing gas accounts for 5-50% of the total mass flow rate of the gas in the furnace; The growth temperature is 400-1300° C. and the growth pressure is 10$^3$-10$^5$ Pa; Plasma current density 0-30 mA/cm$^2$; The magnetic field strength in the deposition zone is 100 G to 30 T;

Then the graphene wall is deposited, and the deposition parameter is: the carbon-containing gas accounts for 5-80% of the total mass flow rate of the gas in the furnace; The growth temperature is 400-1200° C., the growth pressure is 5-10$^5$ Pa; Plasma current density 0-50 mA/cm$^2$; The magnetic field strength in the deposition zone is 100 G to 30 T, a composite electrode having a carbon nanotube/graphene Surface coated boron or nitrogen doped diamond is obtained.

An application of a boron doped diamond electrode, that the electrode is used in the fields of electrochemical wastewater purification treatment, electrochemical biosensor, electrochemical synthesis, and electrochemical detection; Or a diamond foam electrode is compounded with a gas, liquid or solid for use as a heat sink material or a phase change energy storage material or a grinding material;

When the electrode is applied to the treatment of electrochemical sewage, a more efficient and energy-saving treatment method is derived by coupling the electrochemical oxidation of diamond foam doped with niobium-base-boron with interpenetrating porous structure of space network with ozonation, photocatalytic degradation and biological oxidation technology.

The invention proposes to prepare a BDD electrode with high electrocatalytic activity and high use efficiency by utilizing the excellent electrochemical performance of boron or nitrogen doped diamond, graphene and carbon nanotubes and the high porosity and specific surface area of the foam electrode material. Compared to a conventional plate electrode or a sintered porous electrode, the network interpenetrating boron doped diamond foam electrode of the invention can provide a larger specific surface area, which can provide a larger current intensity by lower current density, the electrode can greatly improve the mass transfer process and greatly improve the current efficiency; At the same time, the specific surface area of the electrode can be further increased by surface modification of graphene or carbon nanotubes and enhance the conductivity and electrocatalytic performance of the electrode, thereby improving the sewage treatment efficiency of the electrode.

The invention not only combines the advantages of the diamond film and the metal niobium in electrochemical application, but also exerts the advantages of the network interpenetrating structure in fluid diffusion and convection. The electrode can be widely used in the fields of electrochemical synthesis of strong oxidants, electrochemical wastewater treatment, electrochemical detection, electrochemical biosensors and the like.

The invention consists of a boron doped diamond electrode consisting of a foam skeleton/boron-doped or nitrogen diamond layer or a foam skeleton/modified layer/boron-doped or nitrogen diamond layer. This boron doped or nitrogen-diamond layer is uniformly deposited on the surface of the foam skeleton by a chemical vapor deposition method. The boron doped or nitrogen-diamond layer is selected from the group consisting one of boron doped or nitrogen diamond, graphene coated boron-doped or nitrogen-diamond, carbon nanotube-coated boron-doped or nitrogen diamond, carbon nanotube/graphene coated boron doped or nitrogen-diamond. The foam skeleton is selected from the group consisting one of foam organics, metal foams and alloys, and foamed inorganic non-metal materials. Compared to a conventional plate electrode or a sintered porous electrode, the boron doped diamond electrode of the invention is a network interpenetrating through hole, the holes are uniformly distributed, and the hole size is arbitrarily adjustable within a range of 0.01 to 10 mm. This holes provide a larger specific surface area and the electrodes can provide greater current strength by lower current densities; At the same time, the fluid arbitrary flow between the mutually perforated holes of the network is achieved, which can greatly improve the mass transfer process and greatly improve the current efficiency; In addition, the specific surface area of the electrode can be furtherly increased by surface modification of graphene or carbon nanotubes to enhance the conductivity and electrocatalytic performance of the electrode, thereby improving the sewage treatment efficiency of the electrode. The electrode not only combines the advantages of boron or nitrogen doped diamond and metal niobium in electrochemical performance, but also exerts the advantages of network interpenetrating structure in fluid diffusion and convection. The electrode can be widely used in the fields of electrochemical sewage purification treatment, electrochemical biosensor, electrochemical synthesis of strong oxidant, electrochemical detection and so on.

Advantages of the Invention:

(1) Relative to other substrates, metal niobium is a functional material with important strategic significance. It has a high melting point, good cold workability, and a large dielectric constant of the surface oxide film. Metal niobium has high chemical stability, strong resistance to liquid metal and acid and alkali corrosion. It has great prospects in electrical science and electrochemical fields and is the best matrix material for boron doped diamond electrodes.

(2) Relative to other electrode materials, the boron doped diamond electrode has a wide potential window and a very low background current. The electrode can basically meet the electrochemical degradation of various organic substances. In addition, the boron doped diamond electrode has many advantages such as wide window width, small background current, good electrochemical stability, good mechanical properties, strong corrosion resistance and good electrical conductivity. It has a good prospect in the fields of electrochemical synthesis of strong oxidants, electrochemical wastewater treatment, electrochemical detection, electrochemical biosensors, etc.

(3) Compared to a conventional flat electrode or a BDD electrode prepared by powder metallurgy sintered porous metal as a surface of substrate, the boron doped diamond foam electrode in the invention is a network interpenetrating through hole, and the holes are evenly distributed, and the hole size is arbitrarily adjustable in a range of 0.01 to 10 mm. These holes can provide a larger specific surface area and the electrodes provide a larger current intensity by lower current density; At the same time, the fluid can arbitrary flow between the interpenetrating through holes of the network can be achieved, which can greatly improve the mass transfer process and greatly improve the current efficiency;

(4) Meanwhile, the electrode in the invention can further increase the specific surface area of the electrode by modifying the graphene or the carbon nanotube on the surface to enhance the conductivity and electrocatalytic performance of the electrode, thereby improving the sewage treatment efficiency of the electrode. In addition, such electrodes can also be used in fields such as biosensors;

(5) Application of the boron doped diamond electrode proposed by the invention, the space network interpenetrating porous structure can be used in combination with technologies such as ozone and photocatalysis. For example, the photodegradation catalyst particles are compounded on a boron doped or nitrogen-diamond surface, electrochemical degradation and photocatalytic degradation can be carried out simultaneously, it saves space and efficiently treating organic wastewater.

Therefore, it is very meaningful to study the porous network boron doped diamond electrode in the interstitial structure of the space network. It is also predicted that the electrode will play an extremely important application value in the near future.

In the invention, the above process is used, a large number of micropores and sharp cones configurations are uniformly obtained on the surface of the hetero-boron-doped diamond electrode, and the pores greatly increase the specific surface area and mass transfer efficiency, thereby improving the activity of the electrode. With the development of large area chemical vapor deposition (CVD), it is possible to deposit high quality diamond on the surface of complex configurations. In recent years, the gradual development of the thermocatalytic etching process can also ensure the microholes and sharp cones of different morphology on the boron-doped diamond surface are etched. Obviously, this material has a large electrochemical reaction interface and has a great application prospect in electrochemical electrode materials.

Compared to traditional flat electrodes, the high specific surface area boron or nitrogen doped diamond electrode of the invention can greatly improve the mass transfer process by effectively designing the electrode configuration. Holes and sharp cones obtained by thermal catalytic etching on the boron doped diamond surface also provide a larger specific surface area. The electrode provides a larger current intensity by lower current density and also provides a larger current efficiency; at the same time, the electrode conductivity and electrocatalytic performance can be furtherly increased by surface modification of graphene or carbon nanotubes, thereby improving the sewage treatment efficiency of the electrode. The electrode can be widely used in the fields of electrochemical synthesis of strong oxidants, electrochemical wastewater treatment, electrochemical detection, electrochemical biosensors and so on.

The Advantages of this Patent:

(1) Relative to other electrode materials, the boron doped diamond electrode has a wide potential window and a very low background current. The electrode can basically meet the electrochemical degradation of various organic substances. In addition, the boron doped diamond electrode has many advantages such as wide window width, small background current, good electrochemical stability, good mechanical properties, strong corrosion resistance and good electrical conductivity. It has a good prospect in the fields of electrochemical synthesis of strong oxidants, electrochemical wastewater treatment, electrochemical detection, electrochemical biosensors, etc.

(2) Compared to a conventional slab electrode or a BDD electrode prepared by using a powder metallurgy sintered porous metal as a substrate surface, the surface of the boron doped diamond electrode of the invention is evenly distributed with a large number of micro-holes and sharp cones, and the hole size is arbitrarily adjustable in a range of 500 nm to 5 mm. The holes can provide a larger specific surface area, and the electrodes provide a larger current intensity by lower current density; Simultaneously, the electrode structure can be designed into one of a flat type, a cylindrical type, a plane spiral type, a cylindrical spiral type, a planar braided network type, a three-dimensional braided network type, a honeycomb porous type, and a foamed porous type according to actual needs of sewage treatment. The fluid can arbitrary flow between the interpenetrating through holes of the network can be realized, which can greatly improve the mass transfer process and greatly improve the current efficiency;

(3) At the same time, the invention can furtherly increase the specific surface area of the electrode by modifying the graphene or carbon nanotubes on the surface to enhance the conductivity and electrocatalytic performance of the electrode, thereby improving the sewage treatment efficiency of the electrode. In addition, such electrodes can also be used in fields such as biosensors;

(4) The application of boron or nitrogen doped diamond foam electrode proposed by the invention can be used by coupling the high specific surface area boron or nitrogen doped diamond electrode with ozone, photocatalysis, etc. For example, the photodegradation catalyst particles are composited on the surface of boron doped diamond can be degraded simultaneously by electrochemical degradation and photocatalytic degradation, which can save space meanwhile save energy to the treatment of organic wastewater.

Therefore, the study of boron doped diamond electrode with high specific surface area is of great significance, and it can also be predicted that the electrode will play an extremely important application value in the near future.

In conclusion, the present invention has the advantages of reasonable structure, high electrocatalytic activity and high current efficiency; The electrode not only combines the advantages of boron doped diamond and metal niobium in electrochemical performance, but also exerts the advantages of interpenetrating network structure in fluid diffusion and convection, which can be widely used in electrochemical wastewater purification, electrochemical biosensor, electrochemical synthesis of strong oxidants, electrochemical detection and other fields.

BRIEF DESCRIPTION OF THE DRAWINGS

In FIGS. 3a-3h,

FIG. 3a is the SEM image of BDD/CNT film surface which has catalyzed growth after sputtering nickel for 15 s, and FIG. 3b is an enlarged drawing of FIG. 3a;

FIG. 3c is the SEM image of BDD/CNT film surface which has catalyzed growth after sputtering nickel for 30 s, and FIG. 3d is an enlarged drawing of FIG. 3c;

FIG. 3e is the SEM image of BDD/CNT film surface which has catalyzed growth after sputtering nickel for 60 s, and FIG. 3f is an enlarged drawing of FIG. 3e;

FIG. 3g is the SEM image of BDD substrate surface;

FIG. 3h is the EDX spectra of BDD/CNT film surface which has catalyzed growth after sputtering nickel for 15 s.

In FIGS. 4a-4c, the SEM image of diamond/carbon nanotube composite film obtained by catalytic growth of 0.5%, 5%, 10% methane concentration respectively;

FIGS. 4d-4f is the Raman spectrum of the composite film corresponding to FIGS. 4a-4c.

In the drawings:

In FIG. 1,

1—Regulated DC power supply, 2—Stainless steel electrode, 3—Foam substrate BDD electrode, 4—Electrolyzer, 5—Peristaltic pump, 6—Beaker.

In FIG. 2,

From FIGS. 2a to 2d, it can be seen that a small amount of agglomeration occurs at 700° C., and the nickel film is still completely covered on the diamond surface; When the temperature rises to 800° C., the nickel film further agglomerates, grows and forms strips, finally, the nickel strips are connected to each other to form a metal nickel net covering the diamond film; When the temperature rises to 900° C., nickel agglomeration becomes serious, and only a small amount of nickel strips is left on the diamond surface, which can be seen from the surface exposed after nickel film agglomeration that the original morphology of diamond has changed obviously.

FIGS. 2e-2h are the SEM morphology of diamond films at various temperatures treated by dilute nitric acid for removing nickel. It can be seen from the image that the diamond films are etched more and more seriously with the increase of temperature. At 700° C., the diamond films are partly etched, and exist many uneven protrusions in some serious etched areas, while the other parts still maintain the original diamond morphology; At 800° C., the etching degree is intensified, the bulk diamond is not seen on the surface, and all the regions are etched into protuberance with different length-diameter ratios; When the temperature rises to 900° C., diamond on the surface is completely etched, and the protuberance formed at low temperature becomes another foam-like porous structure.

Figure 1:
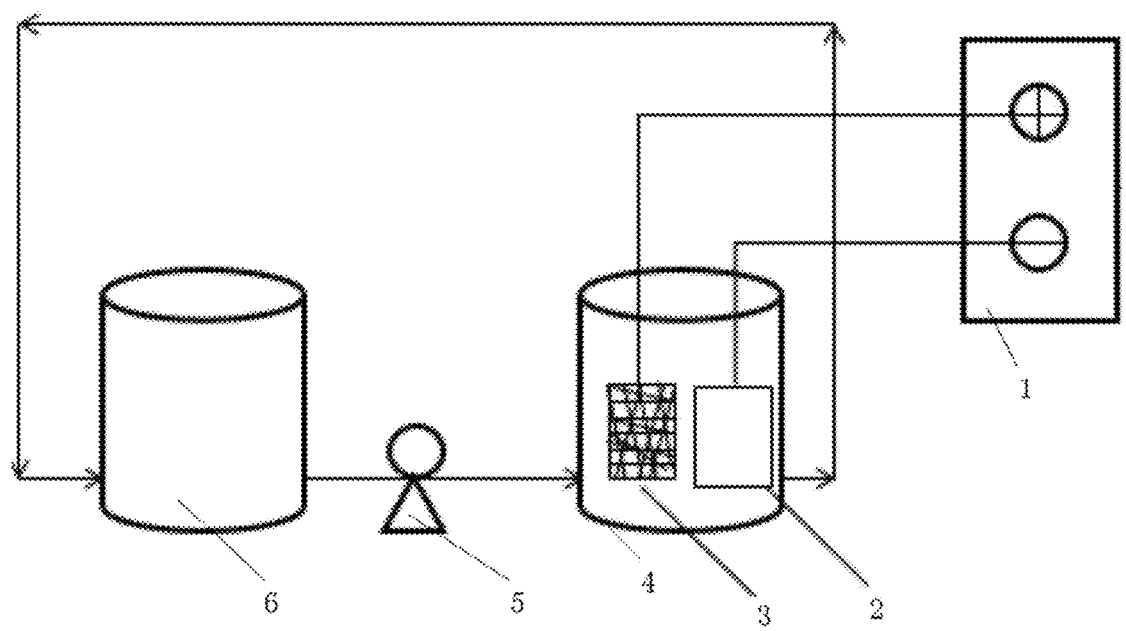
FIG. 1 is a schematic diagram of the device structure for treating organic sewage according to the present invention.
Figure 2A:
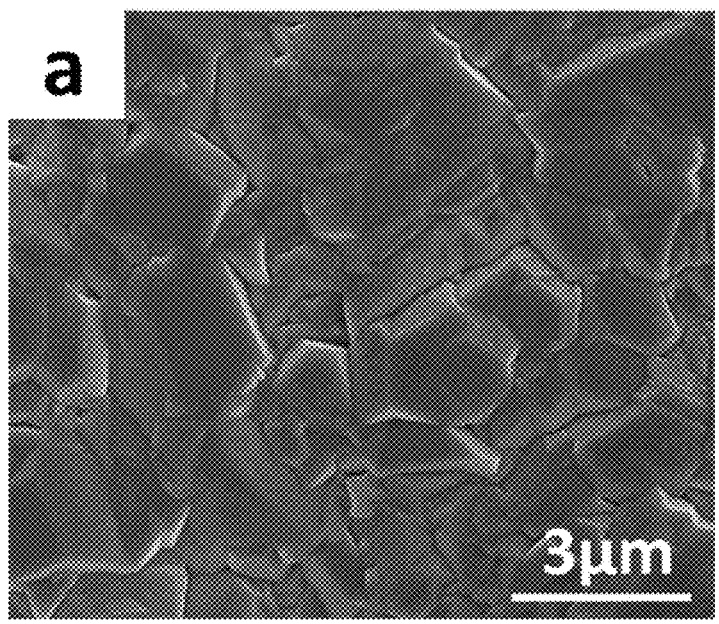
FIG. 2a is the surface SEM morphology of boron doped diamond film prepared in Example 13.
Figure 2B:
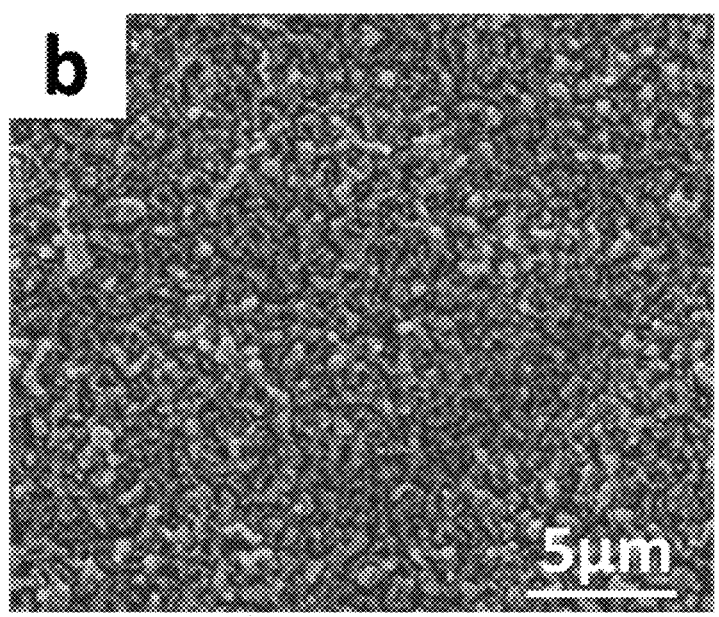
FIG. 2b is the surface SEM morphology of boron doped diamond film prepared in Example 13 which is formed by catalytic etching with metal nickel at 700° C.
Figure 2C:
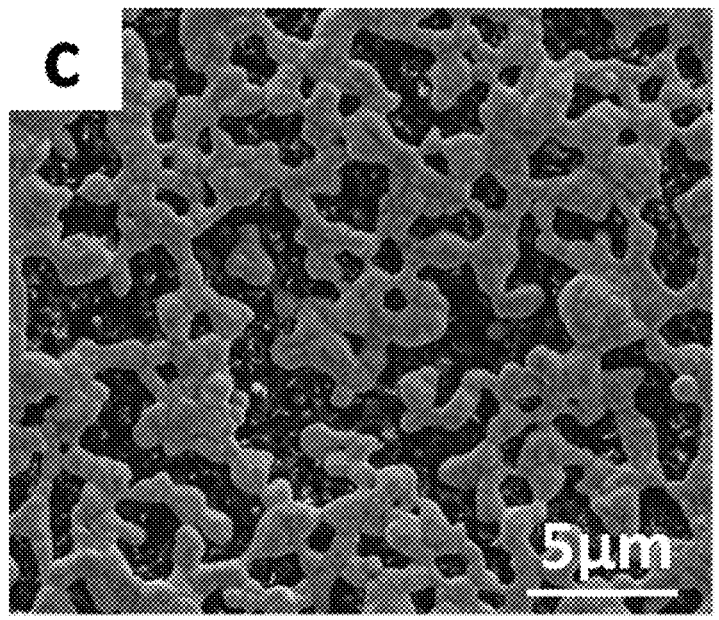
FIG. 2c is the surface SEM morphology of boron doped diamond film prepared in Example 13 which is formed by catalytic etching with metal nickel at 800° C.
Figure 2D:
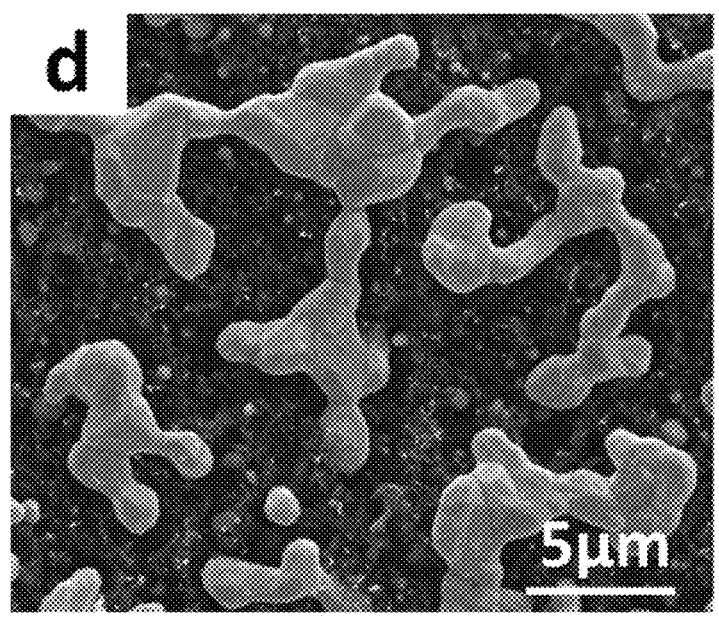
FIG. 2d is the surface SEM morphology of boron doped diamond film prepared in Example 13 which is formed by catalytic etching with metal nickel at 900° C.
Figure 2E:
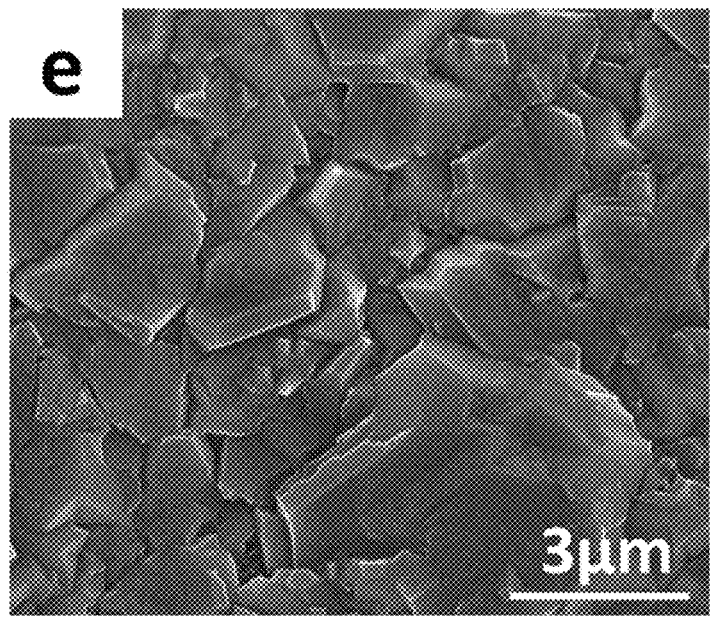
FIG. 2e is the surface SEM morphology of boron doped diamond film prepared in Example 13.
Figure 2F:
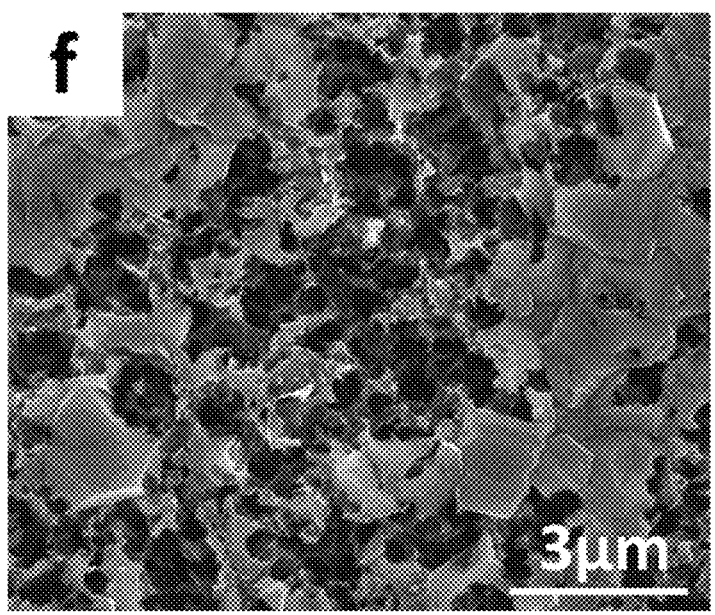
FIG. 2f is the surface SEM morphology of boron doped diamond film prepared in Example 13 which is formed by catalytic etching with metal nickel at 700° C. and the nickel has been removed by dilute nitric acid.
Figure 2G:
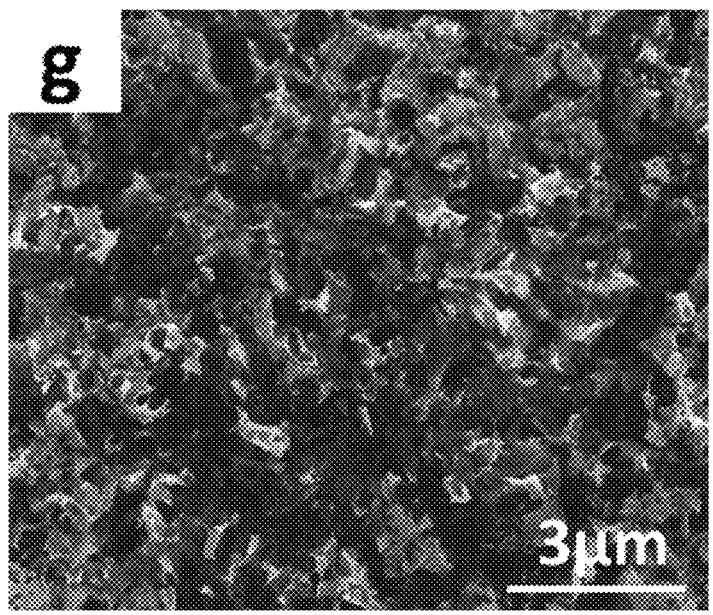
FIG. 2g is the surface SEM morphology of boron doped diamond film prepared in Example 13 which is formed by catalytic etching with metal nickel at 800° C. and the nickel has been removed by dilute nitric acid.
Figure 2H:
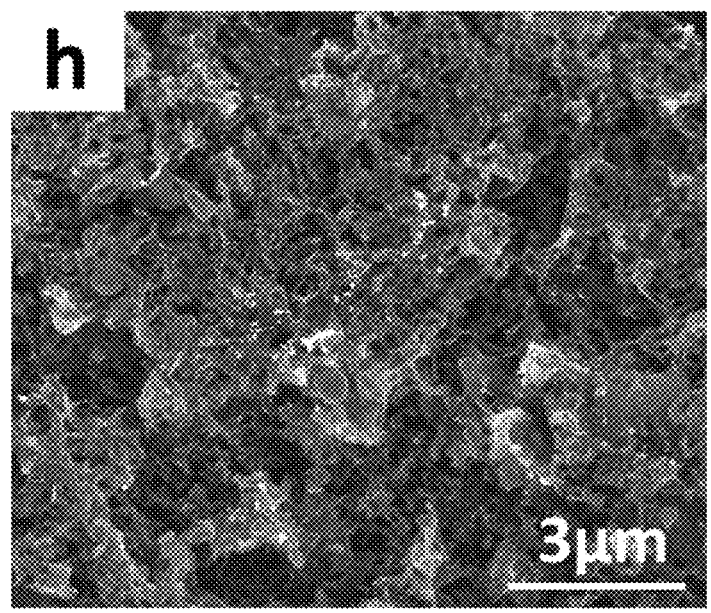
FIG. 2h is the surface SEM morphology of boron doped diamond film prepared in Example 13 which is formed by catalytic etching with metal nickel at 900° C. and the nickel has been removed by dilute nitric acid.
Figure 3A:
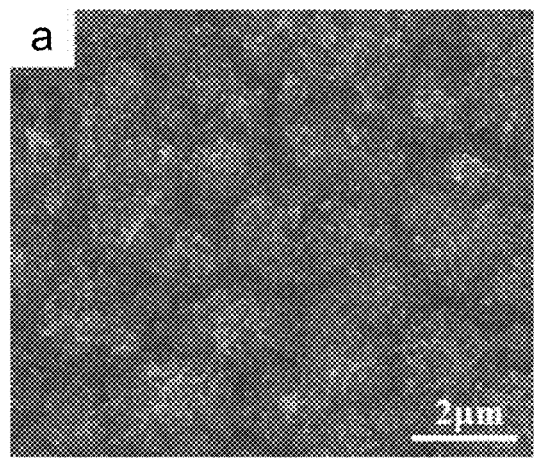
FIGS. 3a-3h are the SEM image and EDX spectra of the surface morphology of BDD/CNT film which has catalyzed growth after different Ni sputtering time prepared in Example 14.
Figure 3B:
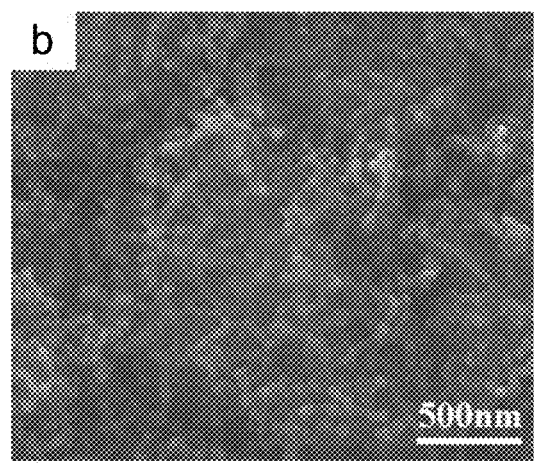
Figure 3C:
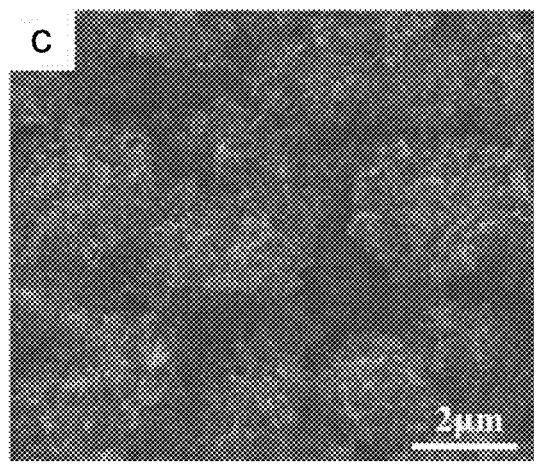
Figure 3D:
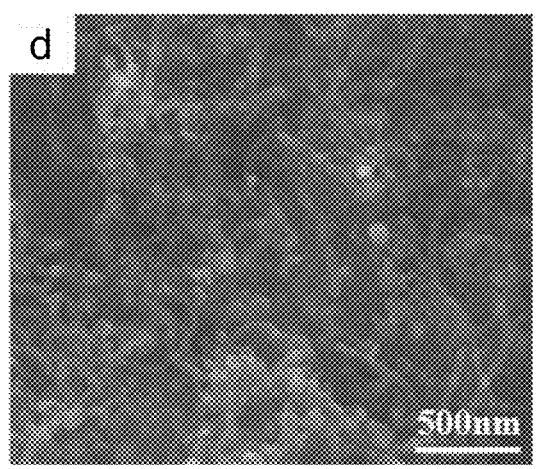
Figure 3E:
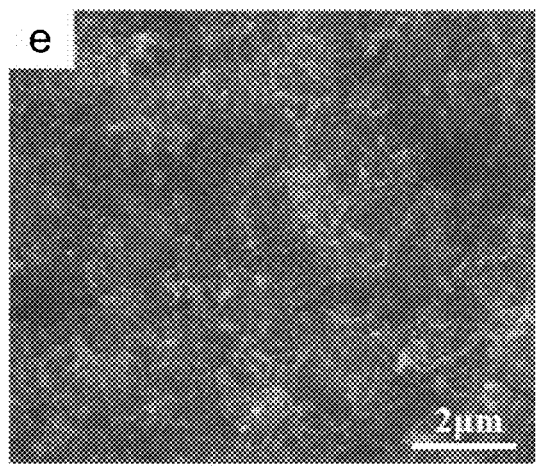
Figure 3F:
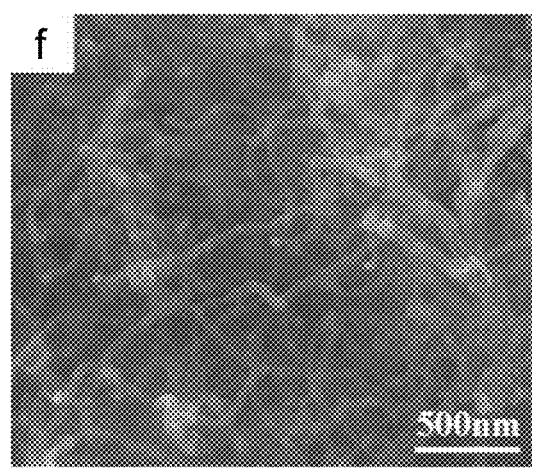
Figure 3G:
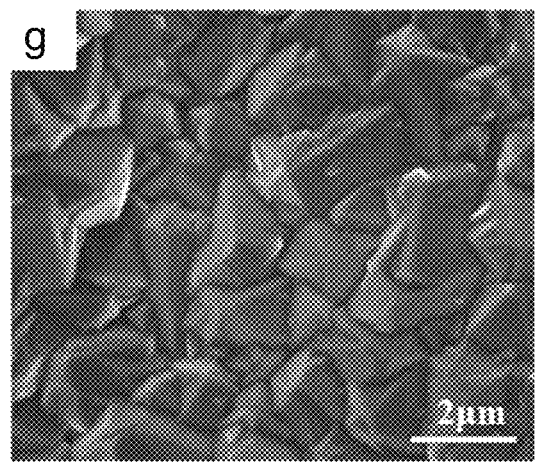
Figure 3H:
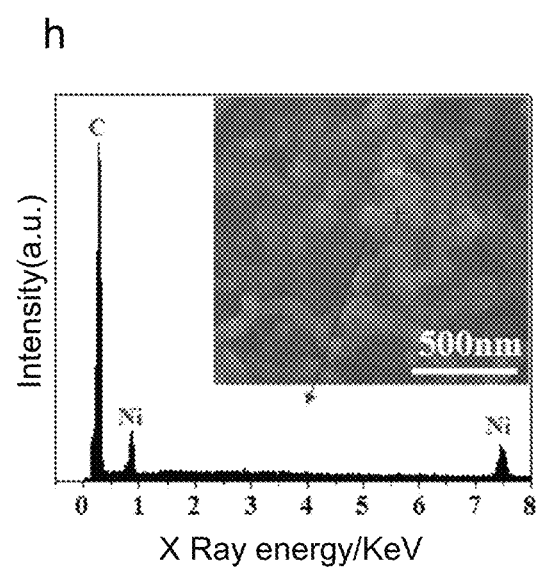

In FIGS. 3a-3h,

FIGS. 3a-3f are the SEM morphological image and its magnification of BDD/CNT (carbon nanotube) composite film which has catalyzed growth after different sputtering Ni time. By comparing the surface morphology of the film before and after Ni catalyzes growth, the typical diamond morphology is not seen on the BDD surface after Ni film catalyzes growth, and the BDD surface was covered with a thick layer of carbon nanotubes (CNTs). Further comparing the surface morphology of BDD/CNT composite film which has catalyzed growth after different sputtering Ni time, it is found that different sputtering Ni thickness has a great influence on the catalytic growth of carbon nanotubes (CNTs). When the sputtering time of Ni is shorter (15 s), the surface of the electrode is covered with a layer of tubular catalytic products, and they are equally distributed, interlaced and superimposed on the electrode surface. The surface morphology of the film has been completely changed and accompanied by the agglomeration of Ni nanoparticles (FIGS. 3c-3d); When the sputtering time of Ni is 30 s, the carbon nanotube coverage on the surface of BDD/CNT composite film decreases, the initial BDD morphology of some regions begins to appear and the length of the tubular catalytic product increases (FIGS. 3c-3d); When the sputtering time of Ni is 60 s, the carbon nanotube coverage on the surface of BDD/CNT composite film decreases further, the initial BDD morphology of most regions is exposed, and the length of the carbon nanotubes catalyzed grown is further increased (FIGS. 3e-3f).

Figure 4A:
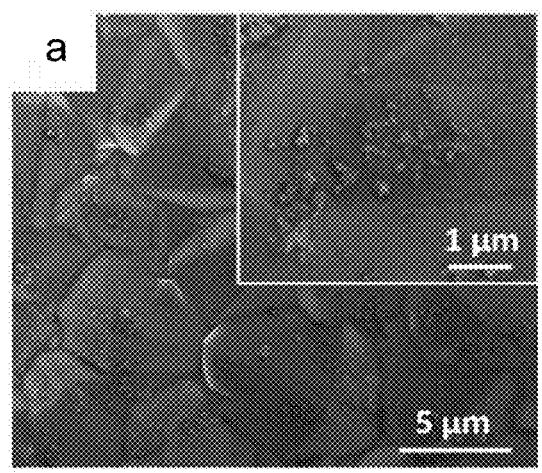
FIGS. 4a-4f are the surface SEM morphology of diamond/carbon nanotube composite film which grows at different concentrations of methane ($CH_4/(CH_4+H_2)$) prepared in Example 15.
Figure 4B:
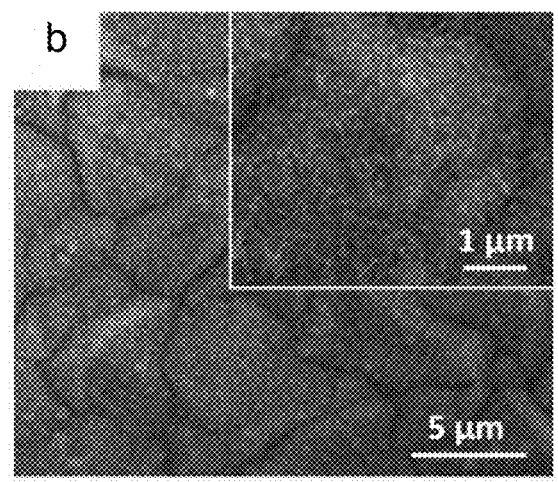
Figure 4C:
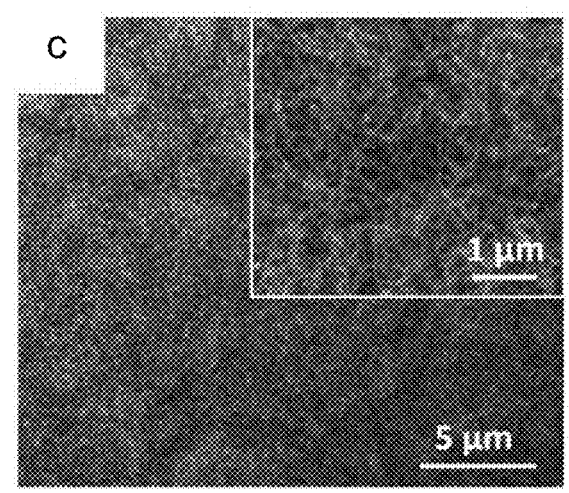

In FIG. 4a-4f,

FIGS. 4a-4c are the SEM morphology of boron-doped diamond/carbon nanotube composite film grown with different methane concentration. It can be seen from the figure that the surface of the original diamond has changed to varying degrees under different methane concentration, and with the increase of methane concentration, the change became more and more obvious, and the number of carbon nanotubes was also increasing. FIG. 4a shows the morphology of diamond surface catalyzed growth by low methane concentration (0.5%). The nickel film on diamond surface produces a certain degree of agglomeration at high temperature and forms a small amount of dispersed agglomeration particles. However, because the concentration of methane did not reach the required concentration of nanotube formation, no catalytic products of tubular morphology were found on the whole surface. It can be seen from the figure that the grain facet on the surface of the film is very clear, and the surface morphology of the original diamond is still maintained. When the concentration of methane increased to 5%, some changes have taken place on the surface of the film. Although the diamond still maintained the original particle morphology, the edge facet of the diamond has become blurred. As can be seen from the amplified FIG. 4b, the diamond surface has been completely covered by short carbon nanotubes about 20 nm in diameter. As the catalytic methane concentration increases to 10% (FIG. 4c), the carbon nanotubes (CNTs) grow further and are interlaced with each other on the diamond surface, and the original diamond morphology on the film surface has been completely changed due to the carbon nanotubes covering.

Figure 4D:
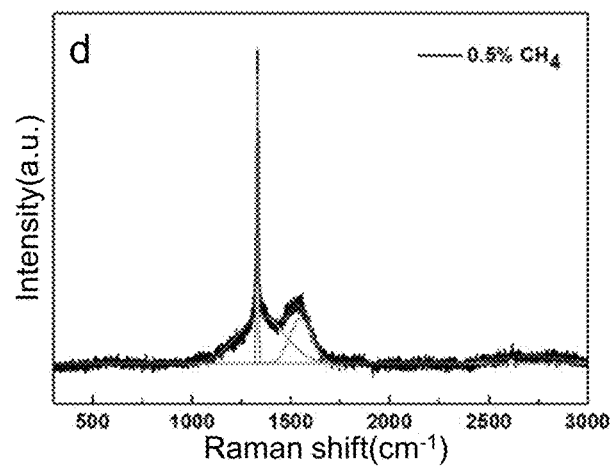
Figure 4E:
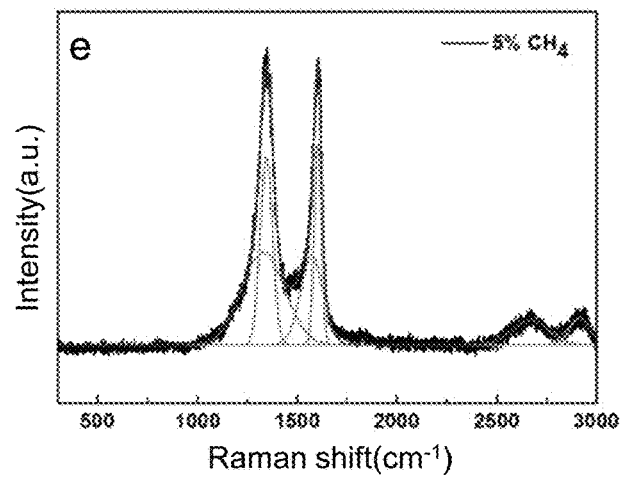
Figure 4F:
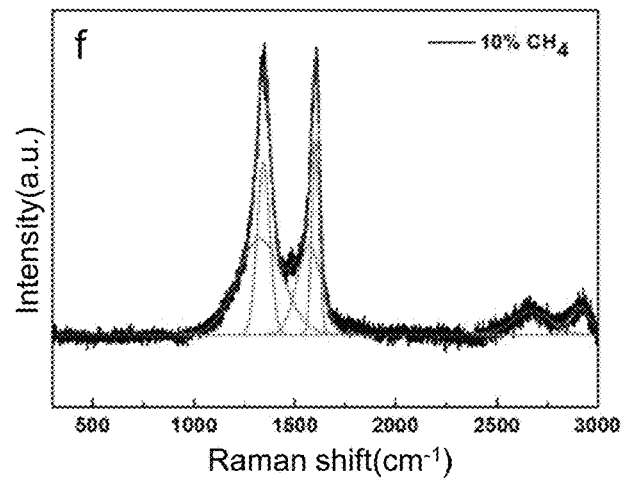

FIGS. 4d-4f show the Raman spectra of the samples obtained under different catalytic concentrations, which Gaussian multimodal fitting was performed, and specific parameter value. It can be seen from the figure that with the increase of the catalytic concentration, the Raman spectra shows a significant change. When the concentration of catalytic methane is 0.5%, there are mainly four characteristic peaks in the spectrum line which is 1332 $cm^{-1}$, 1350 $cm^{-1}$, 1580 $cm^{-1}$ and 2700 $cm^{-1}$, respectively. The highest peak at 1332 $cm^{-1}$ is the characteristic peak of diamond phase (Dia peak). The low "steamed bread peak" at 1350 $cm^{-1}$ and 1580 $cm^{-1}$ is the graphite peak mainly caused by $sp^2$ phase, which is generally called the graphite D peak and G peak. The little dwarf peak at 2700 $cm^{-1}$ in the high frequency band of the spectrum line is the second order characteristic peak of graphite phase, which is called 2D peak. The Raman spectrum showed that the samples grown under low concentration were mainly diamond phase, and the content of $sp^2$ phase such as graphite was low. When the catalytic methane concentration increases continually, the spectral line of samples with 5% and 10% methane concentration changed obviously comparing with those low methane concentration. There are two sharp $sp^2$ characteristic peaks of 1350 $cm^{-1}$ (D peak) and 1600 $cm^{-1}$ (G peak) in the high concentration catalytic samples, which indicates that there is a large amount of graphite phase in the sample. The results of SEM show that the graphite phase is indeed carbon nanotube morphology. In many studies, the ratio of D peak to G peak ($I_D/I_G$) is generally used to measure the graphitization state of disordered carbon materials. The smaller the strength ratio is, the higher the graphite quality of the sample is. The $I_D/I_G$ values of samples with 5% and 10% methane concentration measured by this example are 0.93 and 0.89 respectively. This result shows that the composite membranes have better graphite structure with the increase of catalytic concentration. In addition, the other four dwarf peaks appeared in the two kinds of catalytic samples with high methane concentration: the 1332 $cm^{-1}$ peak was low and the width of half height was large, which indicated that the diamond phase in the sample was very small; The 1580 $cm^{-1}$ and 1600 $cm^{-1}$ belong to the G peak of graphite, and this multi-peak structure occurs because graphene sheets curl into cylindrical tubes when carbon nanotubes are formed. In this case, there will occur symmetry damage caused by tangential Raman vibration of graphite and quantum confinement effect of phonon wave loss along the circumferential direction of carbon nanotubes. However, the general large diameter multi-walled carbon nanotubes have a continuous diameter distribution, which the asymmetric characteristics of the G band are weak and will not appear as 5-6 G peak splits like single-walled carbon nanotubes, but appear a Raman peak near the graphite frequency of 1580 $cm^{-1}$. In addition, the 2700 $cm^{-1}$ (2D) and 2900 $cm^{-1}$ (D+G) peaks in high frequency range can further confirm the existence of carbon nanotubes in the samples.

DESCRIPTION OF THE EMBODIMENTS

Example 1

Sponge+Magnetron Sputtering Nb+Burn Off the Sponge to get the Foam Nb+Ultrasonic Seeding+Electrostatic Adsorption+BDD (1) Depositing a metal niobium foam skeleton on the surface of a sponge foam substrate using magnetron sputtering. The sponge matrix has a pore size of 0.1 mm, an open cell ratio of 50%, and a uniform or random distribution of pores, which is a three-dimensional structure. After the deposition is completed, the sponge is burned at a high temperature to obtain foam niobium.

(2) The foam niobium substrate (3 cm×2 cm×0.3 cm) obtained by step (1) was placed in the suspension of the mixture of nanocrystalline and microcrystalline diamond particles to be oscillated and dispersed evenly in ultrasonic wave, which finally get a foam skeleton lining having nanocrystalline and microcrystalline diamond particles adsorbed on the surface of the mesh.

(3) Depositing diamond film on the foam niobium substrate obtained in the step (2) by HFCVD, the deposition process parameters are as follows: the distance of 6 mm from hot filament to substrate, the substrate temperature of 850° C., the hot filament temperature of 2200° C., the deposition pressure of 3 kPa, the deposition time of 6 hours, and the volume flow ratio of $B_2H_6/CH_4/H_2$ of 0.2:1:99; Then, three-dimensional space network porous boron doped diamond electrode is obtained. The surface layer of the electrode has a grain size of about 10 μm, which is successively decreased toward the core, and the core grain size is about 300 nm.

(4) The boron doped diamond electrode prepared in step (3) is encapsulated, and use the stainless steel electrode as cathode. After connecting the power supply, it was placed in an electrolytic cell having a capacity of 1 L, and the dye was reactive orange X-GN having a concentration of 100 mg/L. The apparatus used for treating organic sewage is shown in the attached drawing (1).

(5) The current density during the degradation process is 100 mA/cm², the supporting electrolyte is sodium sulfate, the concentration is 0.1 mol/L, using sulfuric acid to adjust the solution pH to 3, and the speed of peristaltic pump is 6 L/h. After degradation for two hours, the color removal rate of the dye reached 99%, which was completely degraded.

Example 2

Sponge+Magnetron Sputtering Niobium+Ultrasonic Seeding+Electrostatic Adsorption+BDD (1) A metal niobium foamed skeleton was deposited on the surface of a sponge foamed substrate by using magnetron sputtering. The sponge matrix has a pore size of 0.1 mm, the opened cell ratio of 50%, a uniform distribution of pores or random distribution, the sponge matrix had a three-dimensional structure.

(2) The foamed niobium substrate (having a size of 3 cm×2 cm×0.3 cm) obtained in the step (1) was placed in a suspension of the nanocrystalline and microcrystalline diamond mixed particles, oscillating in the ultrasonic wave and dispersing uniformly, a foamed skeleton lining having nanocrystalline and microcrystalline diamond particles adsorbed on the surface of the mesh was obtained.

(3) The diamond film was deposited on the foamed niobium substrate that was obtained in the step (2) by hot filament chemical vapor deposition, the deposition process parameters were as follows: the hot filament is 6 mm from the substrate, the substrate temperature is 850° C., the hot filament temperature is 2200° C., the deposition pressure is 3 kPa, the deposition time is 6 hours, and the volume flow ratio of $B_2H_6/CH_4/H_2$ is 0.2:1:99; a three-dimensional space network porous boron doped diamond electrode is obtained. The surface layer of the electrode had a grain size of about 10 μm, decreasing in turn toward the core, and the core grain size was about 300 nm.

(4) The boron doped diamond electrode prepared in the step (3) was packaged, using the stainless steel electrode as the cathode, the electrolytic cell with capacity of 1 L after connecting the power supply, the dye was the active orange X-GN with concentration of 100 mg/L. The apparatus used for treating organic sewage was shown in the attached drawing (1).

(5) The current density during the degradation process was 100 mA/cm$^2$, the supporting electrolyte was sodium sulfate, the concentration was 0.1 mol/L, using sulfuric acid to regulate the pH of the solution was 3, the rotational speed of the peristaltic pump was set to 6 L/h. After two hours of degradation, the color removal rate of the dye reached 97%, the basic degradation was complete.

Example 3

Sponge+Magnetron Sputtering Titanium+Magnetron Sputtering Niobium+Ultrasonic Seeding+Electrostatic Adsorption+BDD (1) A metal titanium foamed skeleton was deposited on the surface of the sponge foam substrate by using magnetron sputtering, and then the metal niobium was magnetron sputtered on the surface of the titanium. The sponge matrix had a pore size of 0.1 mm, the opened cell ratio of 80%, the pores were evenly distributed or randomly distributed, the sponge matrix was a three-dimensional structure.

(2) The foamed metal substrate (having a size of 3 cm×2 cm×0.3 cm) obtained in the step (1) was placed in a suspension of the nanocrystalline and microcrystalline diamond mixed particles, oscillating in the ultrasonic wave and dispersing uniformly, a foamed skeleton lining having nanocrystalline and microcrystalline diamond particles adsorbed on the surface of the mesh was obtained.

(3) The diamond film was deposited on the foamed metal substrate that was obtained in the step (2) by hot filament chemical vapor deposition. The deposition process parameters were as follows: the hot filament is 8 mm from the substrate, the substrate temperature is 800° C., the hot filament temperature is 2200° C., the deposition pressure is 3 kPa, the deposition time is 12 hours, the volume flow ratio of $B_2H_6/CH_4/H_2$ is 0.4:1:99; a three-dimensional space network porous boron doped diamond electrode is obtained. The surface layer of the electrode had a grain size of about 20 μm, decreasing in turn toward the core, the core grain size was about 400 nm.

(4) The boron doped diamond electrode prepared in the step (3) was packaged, using stainless steel electrode as the cathode, the electrolytic cell with capacity of 1 L after connecting the power supply, the dye was the active blue KN-R with concentration of 100 mg/L. The apparatus used for treating organic sewage was shown in the attached drawing (1).

(5) The current density during the degradation process was 100 mA/cm$^2$, the supporting electrolyte was sodium sulfate, the concentration was 0.1 mol/L, the solution pH was neutral, the peristaltic pump rotation speed was set to 6 L/h. After two hours of degradation, the dye removal rate of the dye reached 93%, the degradation effect was good.

Example 4

Sponge+Magnetron Sputtering Nickel+Magnetron Sputtering Niobium+Ultrasonic Seeding+BDD (1) A metal nickel foamed skeleton was deposited on the surface of the sponge foam substrate by using magnetron sputtering, and then the metal niobium was magnetronarily sputtered on the surface of the nickel. The sponge matrix had a pore size of 0.05 mm, the opened cell ratio of 50%, the pores were evenly distributed or randomly distributed, the sponge matrix was a two-dimensional planar sheet-like structure.

(2) The foamed metal substrate (having a size of 3 cm×2 cm×0.3 cm) obtained in the step (1) was placed in a suspension of the nanocrystalline and microcrystalline diamond mixed particles, oscillating in the ultrasonic wave and dispersing uniformly, a foamed skeleton lining having nanocrystalline and microcrystalline diamond particles adsorbed on the surface of the mesh was obtained.

(3) The diamond film was deposited on the foamed metal substrate that was obtained in the step (2) by hot filament chemical vapor deposition. The deposition process parameters were as follows: the hot filament is 6 mm from the substrate, the substrate temperature is 800° C., the hot filament temperature is 2200° C., the deposition pressure is 3.5 kPa, the deposition time is 6 hours, the volume flow ratio of $B_2H_6/CH_4/H_2$ is 0.2:1:99; a three-dimensional space network porous boron doped diamond electrode is obtained. The surface layer of the electrode had a grain size of about 10 μm, decreasing in turn toward the core, the core grain size was about 100 nm.

(4) The boron doped diamond electrode prepared in the step (3) was packaged, using the stainless steel electrode as the cathode, the electrolytic cell with capacity of 1 L after connecting the power supply, the dye was the active blue KN-R with concentration of 100 mg/L. The apparatus used for treating organic sewage was shown in the attached drawing (1).

(5) The current density during the degradation process was 100 mA/cm$^2$, the supporting electrolyte was sodium sulfate, the concentration was 1 mol/L, using sulfuric acid to regulate the pH of the solution was 3, the peristaltic pump rotation speed was set to 6 L/h. After two hours of degradation, the color removal rate of the dye reached 90%.

Example 5

Foamed Nickel+Magnetron Sputtering Niobium+Ultrasonic Seeding+Electrostatic Adsorption+BDD (1) A metal ruthenium foamed skeleton was deposited on the surface of the foamed nickel by using magnetron sputtering. The skeleton had a porosity of 80% a, the pore diameter was 0.05 mm.

(2) The foamed metal substrate (having a size of 3 cm×2 cm×0.3 cm) obtained in the step (1) was placed in a suspension of the nanocrystalline and microcrystalline diamond mixed particles, oscillating in the ultrasonic wave and dispersing uniformly, a foamed skeleton lining having nanocrystalline and microcrystalline diamond particles adsorbed on the surface of the mesh was obtained.

(3) The diamond film was deposited on the foamed metal substrate that was obtained in the step (2) by hot filament chemical vapor deposition. The deposition process parameters were as follows: the hot filament is 6 mm from the substrate, the substrate temperature is 850° C., the hot filament temperature is 2200° C., the deposition pressure is 3 kPa, the deposition time is 12 hours, the volume flow ratio of $B_2H_6/CH_4/H_2$ is 0.4:1:99; a three-dimensional space network porous boron doped diamond electrode is obtained. The surface layer of the electrode had a grain size of about 20 μm, decreasing in turn toward the core, the core grain size was about 200 nm.

(4) The boron doped diamond electrode prepared in the step (3) was packaged, using the stainless steel electrode as the cathode, the electrolytic cell with capacity of 1 L after connecting the power supply, the dye was the active blue KN-R with concentration of 100 mg/L. The apparatus used for treating organic sewage was shown in the attached drawing (1).

(5) The current density during the degradation process was 100 mA/cm$^2$, the supporting electrolyte was sodium sulfate, the concentration was 0.1 mol/L, using sulfuric acid to regulate the pH of the solution was 3, the peristaltic pump rotation speed was set to 6 L/h. After two hours of degradation, the dye removal rate of the dye reached 99%, the degradation effect was good.

Example 6

Foamed Copper+Magnetron Sputtering Titanium+Magnetron Sputtering Niobium+Ultrasonic Seeding+BDD (1) A layer of metallic titanium was deposited on the surface of the foamed copper by using magnetron sputtering, and a layer of metal niobium was magnetron sputtered in situ. The skeleton had a porosity of 50%, the pore diameter was 0.1 mm.

(2) The metal foam obtained in the step (1) (having a size of 3 cm×2 cm×0.3 cm) was placed in a suspension of the mixed crystal of the nanocrystalline and microcrystalline diamond, oscillating in the ultrasonic wave and dispersing uniformly, a foamed skeleton lining having nanocrystalline and microcrystalline diamond particles adsorbed on the surface of the mesh was obtained.

(3) The diamond film was deposited on the foamed metal substrate that was obtained in the step (2) by hot filament chemical vapor deposition. The deposition process parameters were as follows: the hot filament is 6 mm from the substrate, the substrate temperature is 850° C., the hot filament temperature is 2200° C., the deposition pressure is 3 kPa, the deposition time is 6 hours, the volume flow ratio of $B_2H_6/CH_4/H_2$ is 0.2:1:99; a three-dimensional space network porous boron doped diamond electrode is obtained. The surface layer of the electrode had a grain size of about 10 μm, decreasing in turn toward the core, the core grain size was about 100 nm.

(4) The boron doped diamond electrode prepared in the step (3) was packaged, using stainless steel electrode as the cathode, the electrolytic solution with a capacity of 1 L after connecting the power source, the inside of the tank was a concentrated solution of the landfill leachate. The apparatus used for treating organic sewage was shown in the attached drawing (1).

(5) The current density during the degradation process was 150 mA/cm$^2$, the supporting electrolyte was sodium sulfate, the concentration was 0.1 mol/L, using sulfuric acid to regulate the pH of the solution was 3, the rotational speed of the peristaltic pump was set to 6 L/h. After three hours of degradation, the COD degradation rate of landfill leachate reached 95%.

Example 7

Copper Foam+Magnetron Sputtering Niobium+Ultrasonic Seeding+BDD (1) A layer of metal ruthenium was deposited on the surface of the foamed copper by using magnetron sputtering, a metal niobium foamed skeleton was obtained. The skeleton had a porosity of 90%, the pore diameter was 0.05 mm.

(2) The metal foam obtained in the step (1) (having a size of 3 cm×2 cm×0.3 cm) was placed in a suspension of the mixed crystal of the nanocrystalline and microcrystalline diamond, oscillating in the ultrasonic wave and dispersing uniformly, a foamed skeleton lining having nanocrystalline and microcrystalline diamond particles adsorbed on the surface of the mesh was obtained.

(3) The diamond film was deposited on the foamed metal substrate that was obtained in the step (2) by hot filament chemical vapor deposition. The deposition process parameters were as follows: the hot filament is 6 mm from the substrate, the substrate temperature is 800° C., the hot filament temperature is 2200° C., the deposition pressure is 3 kPa, the deposition time is 6 hours, the volume flow ratio of $B_2H_6/CH_4/H_2$ is 0.2:1:99; a three-dimensional space network porous boron doped diamond electrode is obtained. The surface layer of the electrode had a grain size of about 10 μm, decreasing in turn toward the core, the core grain size was about 100 nm.

(4) The boron doped diamond electrode prepared in the step (3) was packaged, using the stainless steel electrode as the cathode, the electrolytic solution with a capacity of 1 L after connecting the power source, the inside of the tank was a concentrated solution of the landfill leachate. The apparatus used for treating organic sewage was shown in the attached drawing (1).

(5) The current density during the degradation process was 150 mA/cm$^2$, the supporting electrolyte was sodium sulfate, the concentration was 0.1 mol/L, using sulfuric acid to regulate the pH of the solution was 3, and the rotational speed of the peristaltic pump was set to 6 L/h. After three hours of degradation, the COD degradation rate of landfill leachate reached 87%.

Example 8

Copper Foam+Magnetron Sputtering Titanium+Ultrasonic Implant Seed+BDD (1) A layer of metallic titanium was deposited on the surface of the foamed copper by using magnetron sputtering, a metallic titanium foamed skeleton was obtained. The skeleton has a porosity of 90%, the pore diameter was 0.05 mm.

(2) The metal foam obtained in the step (1) (having a size of 3 cm×2 cm×0.3 cm) is placed in a suspension of nanocrystalline and microcrystalline diamond mixed particles, oscillating in the ultrasonic wave and dispersing uniformly, a foamed skeleton liner with nanocrystalline and microcrystalline diamond particles was obtained.

(3) The diamond film was deposited on the foamed metal substrate that was obtained in the step (2) by hot filament chemical vapor deposition. The deposition process parameters were as follows: the hot wire is 6 mm from the substrate, the substrate temperature is 800° C., the hot wire temperature is 2200° C., the deposition pressure is 3 kPa, the deposition time is 12 hours, the volumetric flow ratio of $B_2H_6/CH_4/H_2$ was 0.2:1:99; a three-dimensional space network porous boron doped diamond electrode was obtained. The surface layer of the electrode had a grain size of about 20 μm, decreasing in turn toward the core, the core grain size was about 200 nm.

(4) The boron doped diamond electrode prepared in the step (3) was packaged, using the stainless steel electrode as cathode, the electrolytic cell with capacity of 1 L after connecting the power supply, the dye was the reactive orange X-GN with concentration of 100 mg/L. The apparatus used for treating organic sewage was shown in the attached drawing (1).

(5) The current density during the degradation process was 100 mA/cm$^2$, the supporting electrolyte was sodium sulfate, the concentration was 0.05 mol/L, using sulfuric acid to regulate the pH of the solution was 11, the peristaltic pump rotation speed was set to 6 L/h.

After two hours of degradation, the dye removal rate of the dye reached 85%.

Example 9

Foam Copper+Ultrasonic Implant Seed+BDD (1) Using copper foam as a metal skeleton, the skeleton has a porosity of 90% and a pore diameter of 0.05 mm. The metal foam is placed in a suspension of the nanocrystalline and microcrystalline diamond mixed particles, oscillated and dispersed uniformly in the ultrasonic wave, and a foam skeleton lining on which the nanocrystalline and microcrystalline diamond particles are adsorbed on the surface of the mesh is obtained.

(2) The hot metal chemical vapor deposited diamond film was prepared on the foam metal substrate (size 3 cm×2 cm×0.3 cm) obtained in the step (1). The deposition process parameters were as follows: the hot filament is 6 mm from the substrate, the substrate temperature is 850° C., the hot filament temperature is 2200° C., the deposition pressure is 3 kPa, the deposition time is 6 hours, the volume flow ratio of $B_2H_6/CH_4/H_2$ is 0.2:1:99; a three-dimensional space network porous boron doped diamond electrode is obtained. The surface layer of the electrode had a grain size of about 15 μm, decreasing in turn toward the core, the core grain size was about 100 nm.

(3) The boron doped diamond electrode prepared in the step (2) was packaged, using the stainless steel electrode as cathode, the electrolytic cell with capacity of 1 L after connecting the power supply, the dye was the reactive orange X-GN with concentration of 100 mg/L. The apparatus used for treating organic sewage was shown in the attached drawing (1).

(4) The current density during the degradation process was 100 mA/cm$^2$, the supporting electrolyte was sodium sulfate, the concentration was 0.05 mol/L, using sulfuric acid to regulate the pH of the solution was 3, the peristaltic pump rotation speed was set to 6 L/h. After two hours of degradation, the dye removal rate of the dye reached 80%.

Example 10

Sintered Porous Ti+Ultrasonic Implanted Seed Crystal+Electrostatic Adsorption+BDD (1) Using sintered porous titanium as a metal skeleton, the porosity of the skeleton was 40%. The metal skeleton is placed in a suspension of nanocrystalline and microcrystalline diamond mixed particles, oscillated and dispersed uniformly in an ultrasonic wave, and a foam skeleton lining on which a nanocrystalline and microcrystalline diamond particles are adsorbed on the surface of the mesh is obtained.

(2) The hot metal chemical vapor deposited diamond film was prepared on the foam metal substrate (size 3 cm×2 cm×0.3 cm) obtained in the step (1). The deposition process parameters were as follows: the hot filament is 6 mm from the substrate, the substrate temperature is 800° C., the hot filament temperature is 2200° C., the deposition pressure is 3 kPa, the deposition time is 6 hours, the volume flow ratio of $B_2H_6/CH_4/H_2$ is 0.2:1:99; a three-dimensional space network porous boron doped diamond electrode is obtained. The surface layer of the electrode had a grain size of about 10 μm, decreasing in turn toward the core, the core grain size was about 100 nm.

(3) The boron doped diamond electrode prepared in the step (3) was packaged, using the stainless steel electrode as cathode, the electrolytic cell with capacity of 1 L after connecting the power supply, the dye was the active blue KN-R with concentration of 100 mg/L. The apparatus used for treating organic sewage was shown in the attached drawing (1).

(4) The current density during the degradation process was 100 mA/cm$^2$, the supporting electrolyte was sodium sulfate, the concentration was 0.05 mol/L, using sulfuric acid to regulate the pH of the solution was 3, the peristaltic pump rotation speed was set to 6 L/h. After two hours of degradation, the dye removal rate of the dye reached 82%.

Example 11

Planar Metal Niobium+Ultrasonic Implant Seed+BDD (1) A flat metal raft was used as an electrode matrix (size 3 cm×2 cm×0.3 cm). The flat metal ruthenium plate is washed with acetone to remove oil and ultrasonically washed with ethanol, and then placed in a suspension of nanocrystalline and microcrystalline diamond mixed particles, oscillated and dispersed uniformly in the ultrasonic wave, and the surface thereof is adsorbed with nanocrystals and micrometers.

(2) The hot metal chemical vapor deposited diamond film was prepared on the flat metal niobium substrate obtained in the step (1). The deposition process parameters were as follows: the hot filament is 6 mm from the substrate, the substrate temperature is 850° C., the hot filament temperature is 2200° C., the deposition pressure is 3 kPa, the deposition time is 6 hours, the volume flow ratio of $B_2H_6/CH_4/H_2$ is 0.2:1:99; a diamond electrode doped with boron on flat niobium plate is obtained. The surface layer of the electrode had a grain size of about 10 μm.

(3) The boron doped diamond electrode prepared in the step (2) was packaged, using the stainless steel electrode as cathode, the electrolytic cell with capacity of 1 L after connecting the power supply, the dye was the reactive orange X-GN with concentration of 100 mg/L. The apparatus used for treating organic sewage was shown in the attached drawing (1).

(4) The current density during the degradation process was 100 mA/cm², the supporting electrolyte was sodium sulfate, the concentration was 0.05 mol/L, using sulfuric acid to regulate the pH of the solution was 3, the peristaltic pump rotation speed was set to 6 L/h. After two hours of degradation, the dye removal rate of the dye reached 75%.

Example 12

Foam Niobium+Ultrasonic Implant Seed+BDD (1) Using foam enamel as a metal skeleton, the skeleton has a porosity of 90% and a pore diameter of 0.05 mm. The metal foam is placed in a suspension of the nanocrystalline and microcrystalline diamond mixed particles, oscillated and dispersed uniformly in the ultrasonic wave, and a foam skeleton lining on which the nanocrystalline and microcrystalline diamond particles are adsorbed on the surface of the mesh is obtained.

(2) The hot metal chemical vapor deposited diamond film was prepared on the foam niobium substrate obtained in the step (1). The deposition process parameters were as follows: the hot filament is 6 mm from the substrate, the substrate temperature is 850° C., the hot filament temperature is 2200° C., the deposition pressure is 3 kPa, the deposition time is 10 hours, the volume flow ratio of $B_2H_6/CH_4/H_2$ is 0.2:1:99; a three dimensional space network porous boron doped diamond electrode is obtained. The surface layer of the electrode had a grain size of about 20 μm, decreasing in turn toward the core, the core grain size was about 400 nm.

(3) The electrochemical detection of glucose by pure BDD electrode showed that the detection sensitivity of pure BDD electrode was extremely low (about 10 $\mu A\ mM^{-1}cm^{-2}$), and the detection limit is 0.5 μM.

(4) Electrochemical detection of glucose by foamed copper composite BDD electrode, time current test results surface foam copper composite BDD electrode sensitivity up to 1642.20 $\mu A mM^{-1}cm^{-2}$, and the detection limit is 0.1 μM, the electrode can detect glucose concentration range of 10 μM-25.5 mM, moreover, the stability of the composite electrode is high, and in the continuous test for up to one month, the current response value still has 90.6% of the initial electrode.

Example 13

Planar Type (Board)

(1) Cleaning the planar niobium substrate;

(2) Depositing a layer of metal chromium having a thickness of 500 nm on the surface of the flat plate by magnetron sputtering;

(3) The chromium-modified plate crucible was placed in a suspension of nanocrystalline and microcrystalline diamond mixed particles, shaken in an ultrasonic wave for 30 min, and uniformly dispersed to obtain a ruthenium matrix having nanocrystalline and microcrystalline diamond particles adsorbed on the surface.

(4) The boron-doped diamond film was deposited by hot-wire CVD. The deposition process parameters are as follows: hot wire distance is 6 mm, deposition temperature is 700-750° C., hot wire temperature is 2200° C., deposition pressure is 3 kPa, gas ratio ($CH_4:H_2:B_2H_6$) (sccm) is 3:97: 0.3, which is controlled the deposition time to obtain a diamond film thickness of 20 μm;

(5) The surface of the boron doped diamond prepared in the step (4) is deposited by a magnetron sputtering deposition method, and the sputtering parameters are a sputtering current of 400 mA, an argon flow rate of 10 sccm, a sputtering pressure of 0.4 Pa, and a sputtering time of 10 min. The thickness of the nickel layer is 500 nm;

(6) The sample prepared according to step (5) is placed in a tube furnace with a vacuum device, the catalytic temperature is set to 700° C., the catalytic etching gas is nitrogen, the catalytic etching pressure is 1 atm, and the catalytic etching time is 2 h;

(7) Boron doped diamond electrode material is obtained with a high specific surface area by furnace cooling.

The SEM morphology of the diamond film at different catalytic etching temperatures is shown in FIG. 2a-2h. As can be seen from FIG. 2a-2d, the nickel film produces a small amount of agglomeration at 700° C., but still completely covers the diamond surface; When the temperature rises to 800° C., the nickel film further agglomerates and grows, and the nickel strips are connected to each other to form a metal nickel mesh covering the diamond film; When the temperature rises to 900° C., the nickel agglomeration is serious, There are only a few nickel bars left on the diamond surface. A small amount of nickel strips, from the surface exposed after the nickel film is agglomerated, which can be seen that the original morphology of the diamond has changed significantly. FIG. 2e-2h show the SEM morphology of the diamond film after nickel treatment with dilute nitric acid. It can be seen from the figure that as the temperature increases, the diamond film is etched more seriously. When the temperature is 700° C., the diamond film is partially etched. Some areas with severe etching have many uneven bumps, while the rest still retain the original diamond morphology. When the temperature is 800° C., the etching degree is intensified and there are no large pieces of diamond exist on the surface. All areas are etched to grow protrusions with different diameter ratios; When the temperature rises to 900° C., the surface diamond is completely etched, and the protrusion formed at low temperature becomes another foam-like porous structure.

Example 14

Planar Type (Plate)

(1) Cleaning the tungsten sheet;

(2) The tungsten sheet is placed in a suspension of nanocrystalline and microcrystalline diamond mixed particles, shaken in an ultrasonic wave for 30 min, and uniformly dispersed to obtain a ruthenium matrix having nanocrystalline and microcrystalline diamond particles adsorbed on the surface.

(3) The boron-doped diamond film was deposited by hot filament CVD. The deposition process parameters were as follows: the hot filament is 6 mm from the substrate, the substrate temperature is 700-750° C., the hot filament temperature is 2200° C., the deposition pressure is 3 kPa, the volume flow ratio of $CH_4:H_2:B_2H_6$ is 3:97:03; the thickness of the diamond film is 25 μm by controlling the deposition time;

(4) Metal nickel layer was deposited on the surface of boron doped diamond prepared in step (3) by magnetron sputtering method. The specific sputtering parameters were 400 mA of sputtering current, 10 sccm of argon flow, 0.4 Pa of sputtering pressure, and sputtering time were 15 s, 30 s and 60 s, respectively.

(5) Put the sample obtained in step (4) into the tube furnace with vacuum equipments, the catalyst temperature is 800° C., catalytic etching gas is $CH_4$ (1.5 sccm) and $H_2$ (28.5 sccm), catalytic etching pressure is 10 kPa, and catalytic etching time is 40 min.

(6) Boron-doped diamond/carbon nanotube electrode materials with high specific surface area are obtained with furnace cooling, as shown in FIG. 2a-2h.

In FIGS. 3a-3f are the SEM morphological images and their magnifications of BDD/CNT (carbon nanotubes) composite films catalyzed after different sputtering time of Ni. The surface morphology of films before and after Ni catalytic growth were compared. After the catalytic growth of Ni film, the typical diamond morphology could not be seen on the surface of BDD, the surface of BDD was covered with a thick layer of carbon nanotubes. Further comparison of surface morphology of BDD/CNT composite films catalyzed by different sputtering time showed that the thickness of sputtered Ni had a great influence on the catalytic growth of carbon nanotubes. When the sputtering Ni films took a relatively short time (15 s), the electrode surface was covered with a layer of tubular catalytic products, which were evenly distributed, interlaced and superimposed on the electrode surface, and the film surface morphology was completely changed, accompanied by the agglomeration of Ni nanoparticles (FIG. 3a-3b; When the sputtering time of Ni film was 30 s, the coverage of carbon nanotubes on the surface of BDD/CNT composite film decreased, and initial BDD morphology began to appear in some regions, and the length of tubular catalytic products increased (FIG. 3c-3d); When the sputtering time of Ni film was 60 s, the carbon nanotube coverage on the surface of BDD/CNT composite film was further reduced, the initial BDD morphology of most areas was exposed, and the length of the catalytic growth of carbon nanotubes was further increased (FIG. 3e-3f).

Example 15

Planar Type (Plate)

(1) Cleaning the niobium wafer;

(2) Put niobium in nanocrystalline and microcrystalline diamond particle suspensions for ultrasonic oscillation of 30 min, to get niobium substrates with nanocrystalline and microcrystalline diamond grains absorbed on the surface;

(3) Using hot filament CVD technique to deposit boron doped diamond film, the deposition process parameters are as follows: the hot filament is 6 mm from the substrate, the substrate temperature is 700-750° C., the hot filament temperature is 2200° C., the deposition pressure is 3 kPa, the volume flow ratio of $CH_4:H_2:B_2H_6$ is 3:97:03; deposition time is 4 h;

(4) Metal nickel layer was deposited on the surface of the boron doped diamond films obtained in step (3) by magnetron sputtering deposition method. Spraying parameters are sputtering current of 400 mA, the argon gas flow of 10 sccm, sputtering pressure of 0.4 Pa, sputtering time of 60 s;

(5) Samples obtained in step (4) was put in a tube furnace with vacuum equipment. The catalyst temperature is 700° C., the catalytic etching gas $CH_4$ and $H_2$, methane concentration $((CH_4)/(CH_4+H_2))$ are 0.5%, 5%, 10%, catalytic etching pressure is 10 kPa, and catalytic etching time is 40 min.

(6) With furnace cooling to obtain boron doped diamond electrode materials/carbon nanotubes of high specific surface area, as shown in FIG. 3a-3h.

FIG. 4a-4c are the SEM morphologies of boron doped diamond/carbon nanotube composite membranes catalyzed and grew under different concentrations of methane. You can see from the picture that under different concentrations of methane, the different degrees of changes have taken place on the original diamond surface. With the increase of methane concentration, the change was more obvious and the number of carbon nanotubes was also increased. FIG. 4a was the surface morphology of diamond catalyzed and grew under methane of low concentration (0.5%). Nickel on the surface of the diamond film produced a certain degree of reunion at high temperature, formed the reunion of a small amount of dispersed particles, but due to methane concentrations did not reach the demand to generate the nanotubes, the surface did not find a tubular shape catalytic product generation, you can see from figure that crystal grain faceted of the film was clear and still maintained the original diamond surface morphology. When methane concentrations were up to 5%, some changes have taken place in thin film surface, diamond, though still maintained the original particle morphology, but the edge facet has become blurred. It can be seen from the amplification in FIG. 4b that diamond surface has been covered totally by short carbon nanotubes about 20 nm in diameter. As catalytic methane concentrations increased to 10% (FIG. 4c), carbon nanotube growth further, mutual crisscross stacking adhere to the surface of diamond, and as a result of the carbon nanotubes' coverage, the original diamond thin film surface morphology has completely changed.

FIG. 4d-4f are the Guassian multi-peak fitting maps of Raman spectra of samples under different catalytic concentrations and its specific parameter values. It can be seen from the picture that with the increase of catalytic concentration, Raman spectra have identical changes. When catalytic methane concentration was 0.5%, there are four main characteristic peaks appeared at 1332 cm$^{-1}$, 1350 cm$^{-1}$, 1580 cm$^{-1}$, 2700 cm$^{-1}$, respectively. The highest peak at 1332 cm$^{-1}$ was diamond phase characteristic peak (Dia peak), and two low "steamed bread peak" appeared at 1580 cm$^{-1}$ and 1350 cm$^{-1}$ was graphite peak caused by the sp$^2$ phase, commonly referred to as graphite D peak, G peak, respectively. The small peak appears at 2700 cm$^{-1}$ of high frequency peak was the second-order characteristic peak of graphite phase, known as the 2D peak. The Raman spectra show that samples catalyzed and grew under low concentrations of methane are mainly composed of diamond phase and sp$^2$ phase content like graphite was small. When the catalytic methane concentrations continue to rise, the curves of samples under 5% and 10% have obvious changes comparing to that of samples under low catalytic concentrations. Raman spectra of samples catalyzed under high concentrations appeared two sharp sp$^2$ characteristic peaks at 1350 cm$^{-1}$ (D peak) and 1600 cm$^{-1}$ (G peak) at 1350 cm$^{-1}$, show that samples contain a large amount of graphite phase, integrated SEM results, the graphite phase was carbon nanotubes form. In many studies, the ratio of D peak and G peak ($I_D/I_G$) is generally used to measure the graphitization state of disorderly carbon materials, the smaller intensity ratio means the higher quality of the graphite in samples. In this implementation, the $I_D/I_G$ values of samples catalyzed under methane concentrations of 5% and 10% were measured as 0.93 and 0.89, respectively. The results show that with the increase of catalytic concentration, the generated composite membrane has a better graphite structure. In addition, there were another four small peaks appeared in the Raman spectra of two samples catalyzed under high catalytic concentrations: the peak at 1332 cm$^{-1}$ was low and half high width value was big, showed that the diamond phase in the sample was little; graphite G peaks appeared at 1600 cm$^{-1}$ and 1580 cm$^{-1}$, the appearance of multi-peak structure was because when generating carbon nanotubes, graphene will curl into a cylindrical tube, which will lead to the symmetry destruction of graphite tangential Raman vibration and quantum confinement effect of phonon wave loss along the circumferential direction of carbon nanotubes, while large diameter multi-walled carbon nanotubes have continuous diameter distribution, the asymmetric characteristics of G band is weak, so the multi-walled carbon nanotubes will not appear 5-6 G peak splittings like single-walled carbon nanotubes, and only one Raman spectrum peak appears near graphite frequency of 1580 cm$^{-1}$. In addition, peaks at high frequencies of 2700 cm$^{-1}$ (2D) and 2900 cm$^{-1}$ (D+G) can further prove the presence of carbon nanotubes in samples.

Example 16

Planar Spiral Type (1) Cleaning planar spiral niobium substrates;
(2) Depositing a thickness of 500 nm metal tungsten layer on the surface of spiral niobium;
(3) Put niobium in nanocrystalline and microcrystalline-microcrystalline diamond particle suspensions for ultrasonic oscillation of 30 min, to get niobium substrates with nanocrystalline and microcrystalline diamond grains absorbed on the surface;
(4) Using hot filament CVD technique to deposit boron doped diamond film, the deposition process parameters are as follows: the hot filament is 6 mm from the substrate, the substrate temperature is 700-750° C., the hot filament temperature is 2200° C., the deposition pressure is 3 kPa, the volume flow ratio of $CH_4:H_2:B_2H_6$ is 3:97:03; diamond film thickness is 50 μm controlled by deposition time;
(5) Metal cobalt layer was deposited on the surface of the boron doped diamond films obtained in step (4) by magnetron sputtering deposition method. The sputtering current is 450 mA, the argon gas flow is 10 sccm, sputtering pressure is 0.4 Pa, sputtering time is 10 min and the cobalt layer thickness is 1 μm;
(6) Samples obtained in step (5) was put in a tube furnace with vacuum equipment. The catalyst temperature is 700° C., the catalytic etching gas is $H_2$, catalytic etching pressure is 1 atmosphere, and catalytic etching time is 3 h. The electrode materials were distributed evenly over the surface of holes of 9-12 μm.
(7) With furnace cooling to obtain boron doped diamond electrode materials of high specific surface area, as shown in FIG. 3a-3h.

Encapsulating boron doped diamond electrodes prepared by the above steps, using stainless steel electrode as cathode, the electrolytic solution with a capacity of 1 L after connecting the power source, the inside of the tank was a concentrated solution of the landfill leachate. The current density during the degradation process was 150 mA/cm$^2$, the supporting electrolyte was sodium sulfate, the concentration was 0.1 mol/L, using sulfuric acid to regulate the pH of the solution was 3, and the rotational speed of the peristaltic pump was set to 6 L/h. After three hours of degradation, the COD degradation rate of landfill leachate reached 87%.

Example 17

Macroporous Foam Type (1) Cleaning copper foam substrates whose diameter is 0.1 mm;
(2) Depositing a thickness of 500 nm metal molybdenum layer on the surface of copper foam;
(3) Put copper foam modified by molybdenum in nanocrystalline and microcrystalline diamond particle suspensions for ultrasonic oscillation of 30 min, to get copper foam substrates with nanocrystalline and microcrystalline diamond grains absorbed on the surface;
(4) Using hot filament CVD technique to deposit boron doped diamond film, the deposition process parameters are as follows: the hot filament is 6 mm from the substrate, the substrate temperature is 700-750° C., the hot filament temperature is 2200° C., the deposition pressure is 3 kPa, the volume flow ratio of $CH_4:H_2:B_2H_6$ is 3:97:03; diamond film thickness is 50 μm controlled by deposition time;
(5) Metal nickel layer was deposited on the surface of the boron doped diamond films obtained in step (4) by magnetron sputtering deposition method. The sputtering current is 450 mA, the argon gas flow is 10 sccm, sputtering pressure is 0.4 Pa, sputtering time is 20 min and the nickel layer thickness is 1 μm;
(6) Samples obtained in step (5) was put in a tube furnace with vacuum equipment. The catalyst temperature is 900° C., the catalytic etching gas is $N_2$, catalytic etching pressure is 1 atmosphere, and catalytic etching time is 3 h;
(7) With furnace cooling to obtain boron doped diamond electrode materials of high specific surface area, the electrode materials were distributed evenly over the surface of holes above 15 μm.

Encapsulating boron doped diamond electrodes prepared by the above steps, using stainless steel electrode as cathode. After connecting the power supply, it was placed in an electrolytic cell having a capacity of 1 L, and the dye was reactive orange X-GN having a concentration of 100 mg/L. The current density during the degradation process was 100 mA/cm$^2$, the supporting electrolyte was sodium sulfate, the concentration was 0.1 mol/L, using sulfuric acid to regulate the pH of the solution was 3, and the rotational speed of the peristaltic pump was set to 6 L/h. After two hours of degradation, the color removal rate of the dye reached 99%, the basic degradation was complete.

Example 18

Foam Porous Type ((1) Selecting copper foam with a pore size of 0.1 mm, cleaning the copper foam skeleton;
(2) Depositing a layer of metal tungsten having a thickness of 500 nm on the surface of the foamed copper by an evaporation method;
(3) Put copper foam modified by tungsten in a suspensions of nanocrystalline and microcrystalline diamond mixed particles, shaken in an ultrasonic wave for 30 min, uniformly dispersed, obtained a copper foam with nanocrystalline and microcrystalline diamond particles adsorbed on the surface;
(4) Using hot filament CVD technique to deposit boron doped diamond film, the deposition process parameters are as follows: the hot filament is 6 mm from the substrate, the substrate temperature is 700-750° C., the hot filament temperature is 2200° C., the deposition pressure is 3 kPa, the volume flow ratio of $CH_4:H_2:B_2H_6$ is 3:97:03; diamond film thickness is 50 μm controlled by deposition time;

(5) Metal nickel layer was deposited on the surface of boron doped diamond prepared in step (4) by magnetron sputtering deposition method, spraying parameters are sputtering current of 450 mA, the argon gas flow of 10 sccm, sputtering pressure of 0.4 Pa, sputtering time is 20 min, the nickel layer thickness is 1 μm;

(6) The sample prepared in the step (5) is placed in a tube furnace with a vacuum device, the catalytic temperature is set to 900° C., the catalytic etching gas is nitrogen, the catalytic etching pressure is 1 atm, and the catalytic etching time is 3 h;

(7) With furnace cooling to obtain boron doped diamond electrode materials of high specific surface area. The electrode materials were distributed evenly over the surface of holes above 15 μm.

The prepared boron doped diamond electrode was tested for glucose on the CHI 660E electrochemical workstation, the time current method test results show that the detection sensitivity of the composite electrode can reach 2.5 mAmM$^{-1}$cm$^{-2}$, the detection limit is 0.05 μM, the detectable glucose concentration range from 0.1 μM-10 mM, the stability of the composite electrode is high, in the current detection process for one month, the detection sensitivity can still maintain accuracy of more than 90%.

Example 19

Nitrogen Doped Diamond Foam Electrode (1) Selecting copper foam with a pore size of 0.3 mm, removing the metal oxide on the surface of the copper foam with 1 vol. % HCl, then removing the surface oil with acetone;

(2) A metal chromium film as an intermediate transition layer having a thickness of 50 nm is deposited on the surface of the copper foam by a magnetron sputtering method;

(3) Put copper foam modified by chromium in a suspensions of nanocrystalline and microcrystalline diamond mixed particles, shaken in an ultrasonic wave for 30 min, uniformly dispersed, obtained a copper foam with nanocrystalline and microcrystalline diamond particles adsorbed on the surface;

(4) Using hot filament CVD technique to deposit boron doped diamond film, the deposition process parameters are as follows: the hot filament is 6 mm from the substrate, the substrate temperature is 700-750° C., the hot filament temperature is 2200° C., the deposition pressure is 3 kPa, the volume flow ratio of $CH_4:H_2:B_2H_6$ is 3:97:03; the nitrogen doped diamond foamed electrode of a three-dimensional network is obtained. The thickness of the nitrogen doped diamond film is 50 μm.

(5) The boron doped diamond electrode prepared in the step (4) is packaged, using stainless steel electrode as cathode. After connecting the power supply, it was placed in an electrolytic cell having a capacity of 1 L, and the dye was reactive orange X-GN having a concentration of 100 mg/L. The apparatus used for treating organic sewage is shown in the attached drawing (1).

(6) The current density during the degradation process was 100 mA/cm$^2$, the supporting electrolyte was sodium sulfate, the concentration was 0.05 mol/L, using sulfuric acid to regulate the pH of the solution was 3, and the rotational speed of the peristaltic pump was set to 6 L/h. After three hours of degradation, the color removal rate of the dye reached 86%.

What is claimed is:

1. A boron doped diamond electrode, comprising an electrode substrate, a transition layer arranged on the surface of the substrate, a layer of boron doped diamond arranged on the surface of the transition layer, metal particles distributed on the surface of the diamond layer, and micropores and/or sharp cones distributed on the surface of the diamond layer,
    wherein material of the metal particles is selected from iron, cobalt or nickel,
    wherein at least a portion of the micropores are not embedded with the metal particles, and material of the micropores and/or the sharp cones is solid carbon,
    wherein the surface of the diamond layer has a pore size ranging from 9 μm to 5 mm, and a tip diameter ranging from 1 μm to 30 μm.

2. The boron doped diamond electrode according to claim 1, wherein graphene or/and carbon nanotube layer are deposited on the surface of the diamond layer having the micropores and/or the sharp cones.

3. A method of preparing the boron doped diamond electrode according to claim 1, comprising the steps of:
    step 1, depositing a boron or nitrogen doped diamond layer, comprising:
    after an intermediate transition layer is prepared on a surface of an electrode matrix, it is placed in a suspension composed of nanocrystalline and/or microcrystalline diamond mixed particles, and after the nanocrystalline and/or microcrystalline diamond particles are dispersed evenly and embedded on the surface of the electrode matrix by using ultrasonic oscillation, the electrode matrix is removed and dried to form an electrode substrate and a transition layer arranged on the surface of the electrode substrate, and then depositing the boron doped diamond layer in the chemical vapor deposition furnace; or
    after an intermediate transition layer is prepared on a surface of an electrode matrix, one method of spray atomization and electrostatic adsorption is used to grow a nanocrystalline and/or microcrystalline diamond seed on the surface of the electrode matrix to form an electrode substrate and a transition layer arranged on the surface of the electrode substrate, and then depositing the boron or nitrogen doped diamond layer in the chemical vapor deposition furnace;
    the deposition process parameters are:
    the carbon-containing gas accounts for 0.5-10.0% of the total mass flow rate of the gas in the furnace; the growth temperature is 600-1000° C., the growth pressure is $10^3$-$10^4$ Pa; the boron source is one of solid, liquid, and gaseous boron sources;
    step 2, preparing micropores and/or sharp cones on the surface of boron doped diamond layers, comprising:
    a first metal layer having a higher catalytic ability for carbon is deposited on the diamond surface obtained in the first step by magnetron sputtering or electroless plating, and the boron doped diamond layer deposited with the first metal layer is subjected to a first high temperature heat treatment, so that the first metal layer is spheroidized at high-temperature, metal nanospheres and/or micron spheres with mass distribution are formed on the surface of diamond;
    at high temperatures, the carbon atoms in the diamond are continuously dissolved in the metal nanospheres or microspheres, and the metal nanospheres or the solid carbon precipitated by supersaturating the carbon atoms in the metal nanospheres or microspheres are added by adding hydrogen gas, so that the metal nanospheres or microspheres continuously migrate into the interior of the diamond, eventually forming a large number of micropores and/or sharp cones on the surface of the diamond;

material of the first metal layer is selected from one or a composite of metal iron, cobalt, nickel;

the first high-temperature heat treatment temperature is 600-1000° C., the treatment time is 1 min-3 h, the furnace atmosphere is selected from one or a mixture of $CH_4$, $H_2$, $N_2$, Ar gas, and the pressure in the furnace is 0.1-1 atm.

4. The method of preparing the boron doped diamond electrode according to claim 3, wherein a second metal layer that does not form carbides and does not dissolve carbon atoms at a high temperature is prepared on the surface of the diamond which has a large number of microporous and/or sharp cones formed thereon, and then the second metal layer is spheroidized into nano-metal spheres and embedded in the micropores by a second high-temperature heat treatment in a protective atmosphere or a vacuum; metal of the second metal layer is selected from one or a combination of ruthenium, platinum, gold, silver, copper, palladium, iridium;

the second high-temperature heat treatment temperature is 600-1000° C., the time is 1 min -3 h, the furnace atmosphere is selected from one or a mixture of vacuum, $N_2$, Ar gas, and the pressure in the furnace is 0 Pa -1 atm.

5. The method of preparing the boron doped diamond electrode according to claim 3, wherein the chemical vapor deposition is used to deposit graphene or/and carbon nanotube layers on the surface of diamond layers with micropores and/or sharp cones; specific deposition process parameters are:

depositing graphene coated with boron doped diamond layer composite layer:

the deposition parameters are as follows: the carbon-containing gas accounts for 5-80% of the total mass flow rate of the gas in the furnace; the growth temperature is 400-1200° C., the growth pressure is 5-$10^5$ Pa; the plasma current density is 0-50 mA/cm$^2$; the magnetic field strength in the deposition area is 100 G to 30 T;

depositing carbon nanotubes coated with boron or nitrogen doped diamond layer composite layer:

the deposition parameters are as follows: the carbon-containing gas accounts for 5-50% of the total mass flow rate of the gas in the furnace; the growth temperature is 400-1300° C., the growth pressure is $10^3$-$10^5$ Pa; the plasma current density is 0-30 mA/cm$^2$; the magnetic field strength in the deposition area is 100 G to 30 T;

depositing carbon nanotubes/graphene coated with boron doped diamond layer composite layer:

carbon nanotubes are first deposited, and the deposition parameters are as follows: the carbon-containing gas accounts for 5-50% of the total mass flow rate of the gas in the furnace; the growth temperature is 400-1300° C., the growth pressure is $10^3$-$10^5$ Pa; the plasma current density is 0-30 mA/cm$^2$; the magnetic field strength in the deposition area is 100 G to 30 T;

then graphene is deposited, and the deposition parameters are as follows: the carbon-containing gas accounts for 5-80% of the total mass flow rate of the gas in the furnace; the growth temperature is 400-1200° C., the growth pressure is 5-$10^5$ Pa; the plasma current density is 0-50 mA/cm$^2$; the magnetic field strength in the deposition area is 100 G to 30 T.

\* \* \* \* \*